US012687955B2

(12) United States Patent  
Moon et al.

(10) Patent No.: US 12,687,955 B2  
(45) Date of Patent: Jul. 21, 2026

(54) DISPLAY DEVICE

(71) Applicant: LG Display Co., Ltd., Seoul (KR)

(72) Inventors: Hong-Man Moon, Paju-si (KR);  
Yoon-Ji Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/264,449

(22) Filed: Jul. 9, 2025

(65) Prior Publication Data

US 2025/0341932 A1 Nov. 6, 2025

Related U.S. Application Data

(63) Continuation of application No. 18/453,915, filed on Aug. 22, 2023, now Pat. No. 12,386,473.

(30) Foreign Application Priority Data

Aug. 31, 2022 (KR) ........................ 10-2022-0109898

(51) Int. Cl.  
| *G09G 3/30* | (2006.01) |
| *B60K 35/60* | (2024.01) |
| *G06F 3/044* | (2006.01) |
| *G09G 3/36* | (2006.01) |
| *H10H 20/841* | (2025.01) |
(Continued)

(52) U.S. Cl.  
CPC ............ *G06F 3/0448* (2019.05); *B60K 35/60* (2024.01); *H10H 20/841* (2025.01); *H10H 20/853* (2025.01); *H10H 20/855* (2025.01); *H10W 90/00* (2026.01); *B60K 35/10* (2024.01);  
(Continued)

(58) Field of Classification Search  
CPC ............ H10K 50/858; G02F 1/133526; G09G 3/30–3696  
See application file for complete search history.

(56) References Cited

U.S. PATENT DOCUMENTS

| 10,644,083 B2 | 5/2020 | Lee et al. |
| 10,790,474 B2 | 9/2020 | Lee et al. |
(Continued)

FOREIGN PATENT DOCUMENTS

| JP | 2015-088418 A | 5/2015 |
| JP | 2019-032811 A | 2/2019 |
(Continued)

OTHER PUBLICATIONS

The Japan Patent Office, Office Action, Japanese Patent Application No. 2023-139516, Jul. 30, 2024, 14 pages.  
(Continued)

*Primary Examiner* — Sanghyuk Park  
(74) *Attorney, Agent, or Firm* — Fenwick & West LLP

(57) ABSTRACT

A display device may include: a display panel including a display area and a non-display area, the display area having a light emitting area and a non-light emitting area; at least one first barrier layer on the non-light emitting area of the display panel, the at least one first barrier layer configured to block light emitted from the light emitting area; at least one second barrier layer overlapping the at least one first barrier layer in the non-emitting area, the at least one second barrier layer configured to block light emitted from the light emitting area; and at least one lens overlapping the light emitting area and on a same layer as the at least one first barrier layer.

20 Claims, 15 Drawing Sheets

(51) Int. Cl.

| | |
|---|---|
| *H10H 20/853* | (2025.01) |
| *H10H 20/855* | (2025.01) |
| *H10W 90/00* | (2026.01) |
| *B60K 35/10* | (2024.01) |
| *B60K 35/22* | (2024.01) |

(52) U.S. Cl.

CPC ...... *B60K 35/22* (2024.01); *B60K 2360/1434* (2024.01); *G06F 2203/04111* (2013.01)

(56) References Cited

U.S. PATENT DOCUMENTS

| | | | |
|---|---|---|---|
| 11,075,364 B2 | 7/2021 | Kim et al. | |
| 11,258,050 B2 | 2/2022 | Lee et al. | |
| 2015/0084026 A1* | 3/2015 | Miyamoto | H10K 59/879 |
| | | | 257/40 |
| 2017/0115770 A1 | 4/2017 | Han et al. | |
| 2019/0051711 A1 | 2/2019 | Lee et al. | |
| 2019/0074339 A1* | 3/2019 | Ma | H10K 59/131 |
| 2019/0221779 A1 | 7/2019 | Jang et al. | |
| 2020/0083484 A1 | 3/2020 | Lee et al. | |
| 2020/0119113 A1 | 4/2020 | Lee et al. | |
| 2020/0168844 A1 | 5/2020 | Kim et al. | |
| 2020/0358033 A1* | 11/2020 | Koshihara | H10K 59/876 |
| 2020/0381667 A1 | 12/2020 | Lee et al. | |
| 2021/0200382 A1 | 7/2021 | Lee et al. | |
| 2021/0391558 A1 | 12/2021 | Kim et al. | |
| 2022/0199700 A1 | 6/2022 | Shin et al. | |
| 2022/0407039 A1 | 12/2022 | Kim et al. | |
| 2025/0031501 A1 | 1/2025 | Yamauchi et al. | |

FOREIGN PATENT DOCUMENTS

| | | | |
|---|---|---|---|
| JP | 2020-043066 A | 3/2020 |
| KR | 10-2018-0025308 A | 3/2018 |
| KR | 10-2019-0003439 A | 1/2019 |
| KR | 10-2019-0073149 A | 6/2019 |
| KR | 10-2020-0063591 A | 6/2020 |
| KR | 10-2022-0087008 A | 6/2022 |

OTHER PUBLICATIONS

United States Office Action, U.S. Appl. No. 18/453,915, filed Jun. 21, 2024, 19 pages.

United States Office Action, U.S. Appl. No. 18/453,915, filed Dec. 19, 2024, seven pages.

Ministry of Intellectual Property of Korea, Office Action, Korean Patent Application No. 10-2022-0109898, Jan. 15, 2026, 18 pages.

German Patent and Trade Mark Office, Office Action, German Patent Application No. 102023122373.9, Apr. 20, 2026, 22 pages.

* cited by examiner

DISPLAY DEVICE

CROSS REFERENCE TO RELATED APPLICATION

The present application is a continuation of U.S. patent application Ser. No. 18/453,915 filed on Aug. 22, 2023, which claims the priority benefit of Republic of Korea Patent Application No. 10-2022-0109898 filed in Republic of Korea on Aug. 31, 2022, each of which is hereby incorporated by reference in its entirety.

TECHNICAL FIELD

The present disclosure relates to a display device, and more particularly, to a display device where a viewing angle is adjusted or cut off without a light control film.

DISCUSSION OF THE RELATED ART

As a technology for a display device progresses, display devices of various types such as a liquid crystal display (LCD) device and an organic light emitting diode (OLED) display device have been developed.

A display device sensing a touch as well as displaying an image has been widely used, and a display device having a touch sensing layer has been developed.

A display device is used for a vehicle such as a car to provide various information. For example, to prevent obstruction of a view during driving due to reflection of an image of the display device on a windscreen of a car, an additional light control film that controls or cuts off a viewing angle by blocking light emitted along a vertical direction is attached to a display panel of the display device.

However, a luminance of the display device is reduced and a touch sensitivity is deteriorated due to the light control film.

SUMMARY

Accordingly, embodiments of the present disclosure are directed to a display device that substantially obviate one or more of problems due to the limitations and disadvantages of the related art.

The inventors have invented a display device that controls or cuts off a viewing angle without attaching a light control film on a display panel.

An object of the present disclosure is to provide a display device where a viewing angle is controlled or cut off and a front luminance is improved through an increase of a light collection efficiency.

Another object of the present disclosure is to provide a display device where a viewing angle is controlled or cut off without a decrease of a touch sensitivity.

In one embodiment, a display device comprises: a display panel including a display area and a non-display area, the display area having a light emitting area and a non-light emitting area; at least one first barrier layer on the non-light emitting area of the display panel, the at least one first barrier layer configured to block light emitted from the light emitting area; at least one second barrier layer overlapping the at least one first barrier layer in the non-emitting area, the at least one second barrier layer configured to block light emitted from the light emitting area; and at least one lens overlapping the light emitting area and on a same layer as the at least one first barrier layer.

In one embodiment, a display device comprises: a substrate including a display area and a non-display area; a plurality of emitting elements in the display area, the plurality of emitting elements configured to emit light; at least one encapsulating layer on the plurality of emitting elements; at least one barrier layer on the at least one encapsulating layer and non-overlapping with an emitting element from the plurality of emitting elements, the at least one barrier layer configured to block the light emitted by the plurality of emitting elements; and a plurality of lenses on the at least one encapsulating layer, the plurality of lenses overlapping the plurality of emitting elements.

In one embodiment, a display device comprises: a substrate including a display area and a non-display area; a plurality of light emitting elements in the display area, the plurality of light emitting elements configured to emit light; one or more intermediate layers on the plurality of light emitting elements; a plurality of touch electrodes on the one or more intermediate layers and non-overlapping with the plurality of light emitting elements, the plurality of touch electrodes configured to sense touch and block the light emitted from the plurality of light emitting elements; and a plurality of lenses that are overlapping with the plurality of light emitting elements.

Additional features and advantages of the disclosure will be set forth in the description which follows, and in part will be apparent to those skilled in the art from the description or may be learned by practice of the disclosure. These and other advantages of the disclosure may be realized and attained by the structure particularly pointed out in, or derivable from, the written description, claims hereof, and the appended drawings.

It is to be understood that both the foregoing general description and the following detailed description are explanatory and by way of examples and are intended to provide further explanation of the disclosure as claimed without limiting its scope.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIG. 2 is a perspective view showing a display device according to the first embodiment of the present disclosure;

FIG. 3 is a block diagram showing a display device according to the first embodiment of the present disclosure;

DETAILED DESCRIPTION

Figure 1:
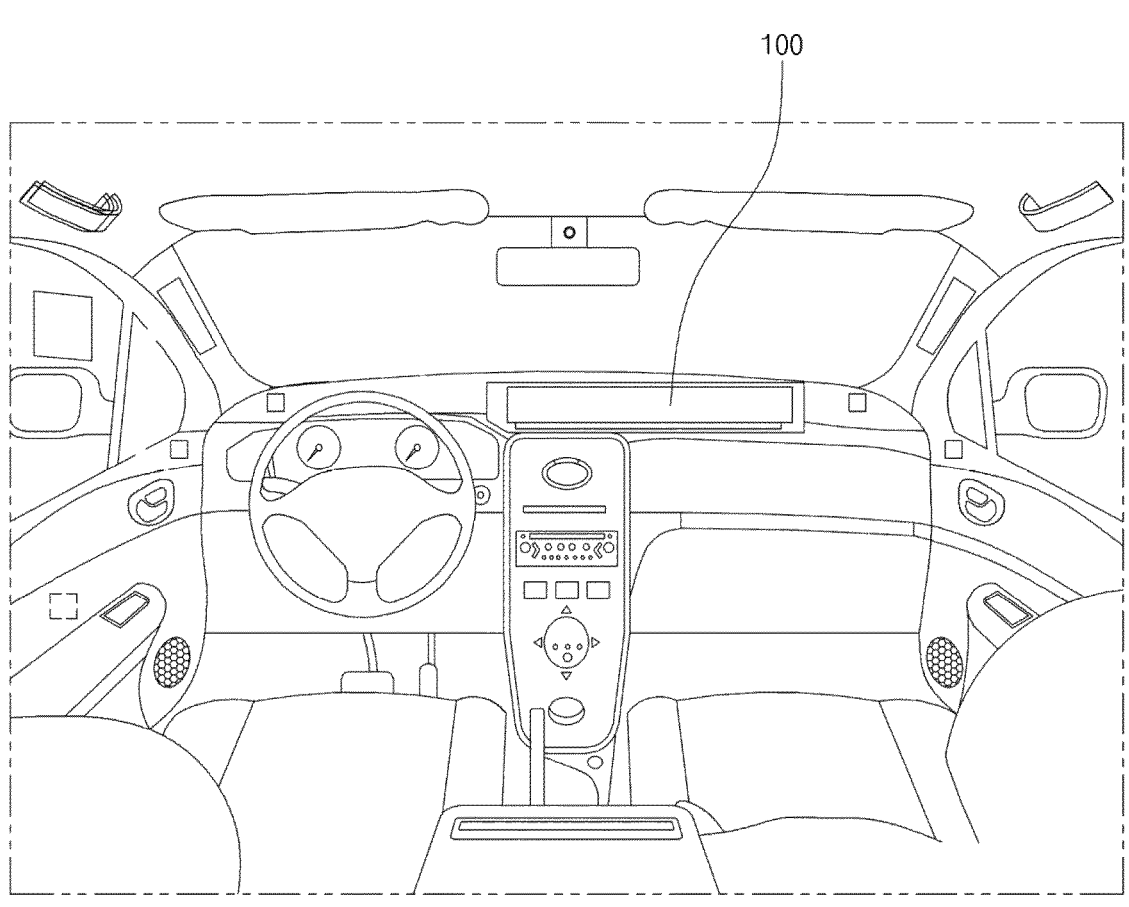
FIG. 1 is view showing an interior of a vehicle having a display device according to a first embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. Like reference numerals refer to like elements throughout, unless otherwise specified.

In the following description, where the detailed description of the relevant known function or configuration may unnecessarily obscure a feature or aspect of the present disclosure, a detailed description of such known function or configuration may be omitted or a brief description may be provided.

Where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is to be construed as including an error or tolerance range even where no explicit description of such an error or tolerance range is provided.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

Although the terms "first", "second", "A", "B", "(a)", "(b)", and the like may be used herein to refer to various elements, these elements should not be interpreted to be limited by these terms as they are not used to define a particular order or precedence. These terms are only used to distinguish one element from another. For example, a first element could be termed a second element, and, similarly, a second element could be termed a first element, without departing from the scope of the present disclosure.

Features of various embodiments of the present disclosure may be partially or entirely coupled to or combined with each other. They may be linked and operated technically in various ways as those skilled in the art can sufficiently understand. The embodiments may be carried out independently of or in association with each other in various combinations.

Hereinafter, a display device according to various example embodiments of the present disclosure will be described in detail with reference to the accompanying drawings.

Figure 2:
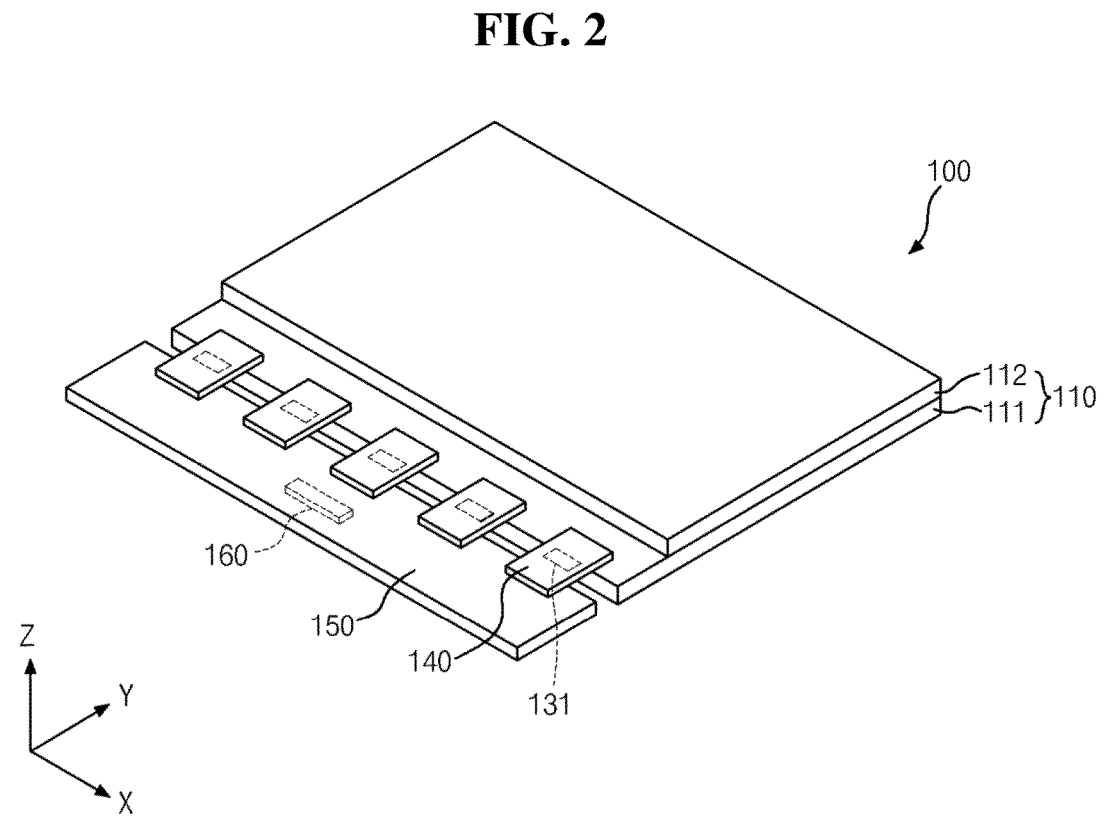
Figure 3:
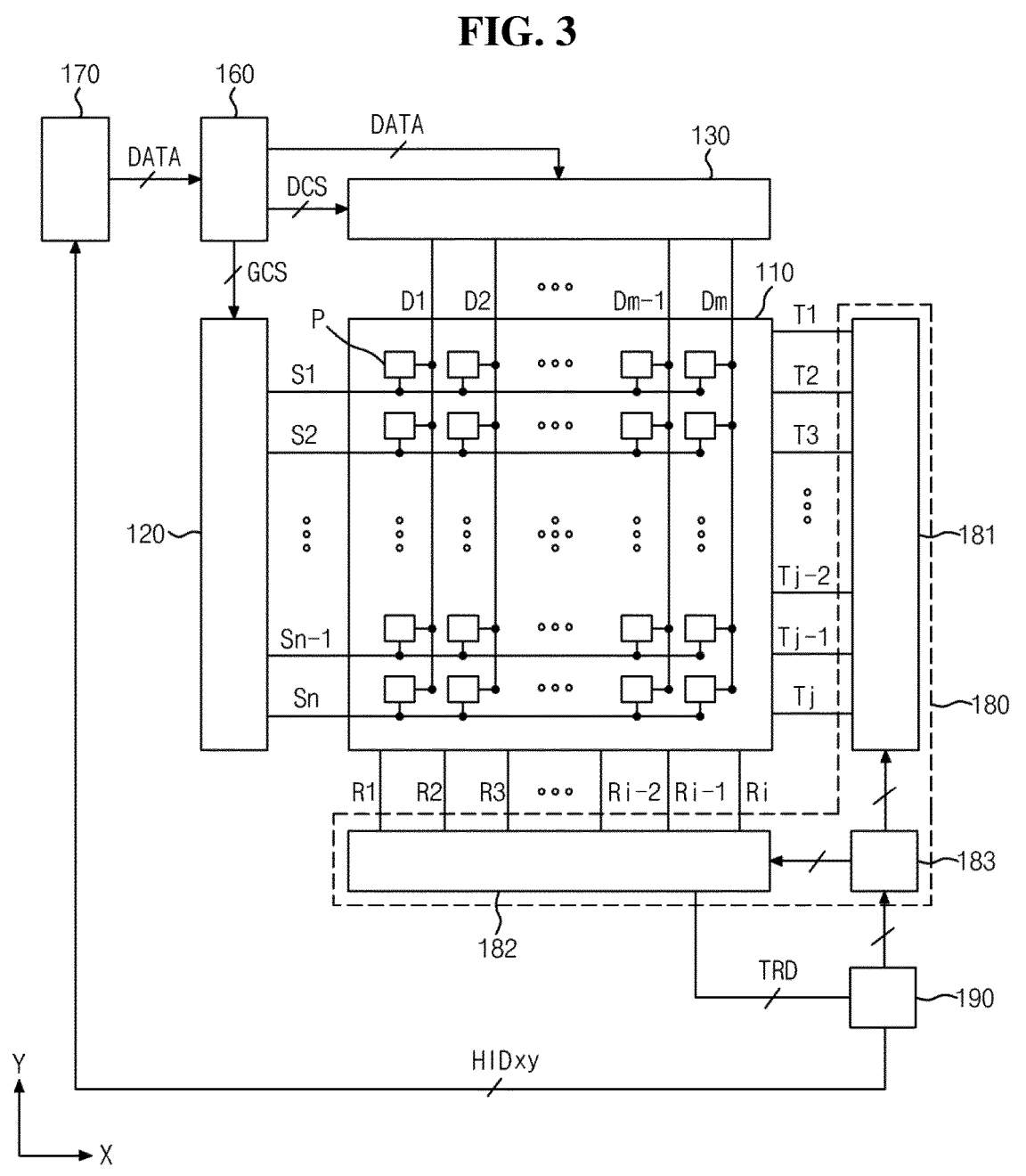

FIG. 1 is view showing an interior of a vehicle having a display device according to a first embodiment of the present disclosure, FIG. 2 is a perspective view showing a display device according to a first embodiment of the present disclosure, and FIG. 3 is a block diagram showing a display device according to a first embodiment of the present disclosure.

In FIG. 1, a display device 100 according to a first embodiment of the present disclosure may be disposed on a portion of a dash board of a vehicle. The dash board may be disposed in front of a front seat (e.g., driver seat, passenger seat) of the vehicle. For example, the dashboard may include an input unit for manipulating various equipment (e.g., air conditioner, audio system, navigation system).

The display device 100 on the dash board may be used as an input unit for manipulating a portion of the various equipment of the vehicle. The display device 100 may provide various information regarding the vehicle, for example, a driving information (e.g., present speed, residual fuel quantity, mileage) and a part information (e.g., damage degree of tire).

The display device 100 may be disposed to extend across the driver seat and the passenger seat in the front seat of the vehicle. A user of the display device 100 may include a driver of the vehicle and a fellow passenger in the passenger seat. Both of the driver and the fellow passenger may use the display device 100.

FIG. 1 may show a portion of the display device 100. FIG. 1 may show a display panel among a plurality of elements of the display device 100. The other elements of the display device 100 may be disposed in the interior (or a portion) of the vehicle.

In FIGS. 2 and 3, the display device 100 according to the first embodiment of the present disclosure includes a display panel 110, a scan driving unit 120 (e.g., a circuit), a timing controlling unit 160 (e.g., a circuit), a host system 170, a touch driving unit 180 (e.g., a circuit), and a touch coordinate calculating unit 190 (e.g., a circuit).

Although the display device 100 is exemplarily illustrated as an organic light emitting diode (OLED) display device in a first embodiment of the present disclosure, the display device 100 may be various display devices such as a liquid crystal display (LCD) device in another embodiment.

The display panel 110 may include a first substrate 111, a second substrate 112 and a thin film transistor layer, an emitting element layer, an encapsulating layer and a touch sensing layer between the first and second substrates 111 and 112. The embodiments of the present disclosure are not limited thereto. The second substrate 112 may include a plastic film, a glass substrate or an encapsulation film.

The display panel 110 may include a display area where a plurality of subpixels P display an image. A plurality of data lines D1 to Dm (m is a positive integer greater than or equal to 2) and a plurality of scan lines S1 to Sn (n is a positive integer greater than or equal to 2) are formed in the display panel 110. The plurality of data lines D1 to Dm and the plurality of scan lines S1 to Sn may cross each other. A scan line may be referred to as a gate line. The subpixel P may be disposed in a region defined by crossing of the scan line and the data line.

Each of the plurality of subpixels P of the display panel 110 may be connected to one of the plurality of data lines D1 to Dm and one of the plurality of scan lines S1 to Sn.

Each of the plurality of subpixels P of the display panel 110 may include a driving transistor adjusting a current between a source electrode and a drain electrode according to a data voltage applied to a gate electrode, a scan transistor turned on according to a scan signal of the scan line and supplying the data voltage of the data line to the gate electrode of the driving transistor, a light emitting diode emitting a light according to the current between the source electrode and the drain electrode of the driving transistor and a storage capacitor storing a voltage of the gate electrode of the driving transistor. As a result, each subpixel P may emit a light according to a current supplied to the light emitting diode.

The scan driving unit 120 receives a scan control signal GCS from the timing controlling unit 160. The scan driving unit 120 supplies the scan signal to the plurality of scan lines S1 to Sn according to the scan control signal GCS.

The scan driving unit 120 may be disposed in a non-display area at one side or both sides of a display area of the display panel 110 as a gate in panel (GIP) type. Alternatively, the scan driving unit 120 may be formed as a driving chip mounted on a flexible film and may be attached to the non-display area at one side or both sides of a display area of the display panel 110 as a tape automated bonding (TAB) type.

The data driving unit 130 receives a digital video data DATA and a data control signal DCS from the timing controlling unit 160. The data driving unit 130 converts the digital video data DATA into an analog data voltage of positive and negative polarities according to the data control signal DCS and supplies the analog data voltage to the plurality of data lines D1 to Dm. For example, the subpixel P where the data voltage is supplied is selected according to the scan signal of the scan driving unit 120 and the data voltage is supplied to the selected subpixel P.

The data driving unit 130 may include a plurality of source drive integrated circuits (ICs) 131. Each of the plurality of source drive ICs 131 may be mounted on a flexible film 140 as a chip on film (COF) type or a chip on plastic (COP) type. The flexible film 140 may be attached to pads in the non-display area of the display panel 110 using an anisotropic conductive film (ACF) such that the plurality of source drive ICs 131 are connected to the pads.

A circuit board 150 may be attached to the flexible film 140. A plurality of circuits as driving chips may be mounted on the circuit board 150. For example, the timing controlling unit 160 may be mounted on the circuit board 150. The circuit board 150 may include a printed circuit board (PCB) or a flexible printed circuit board.

The timing controlling unit 160 receives the digital video data DATA and a plurality of timing signals from the host system 170. The plurality of timing signals may include a vertical synchronization signal, a horizontal synchronization signal, a data enable signal and a dot clock. The vertical synchronization signal is a signal defining one frame period. The horizontal synchronization signal is a signal defining one horizontal period required for supplying the data voltage to the subpixels of one horizontal line of the display panel 110. The data enable signal is a signal defining a period where an effective data is inputted. The dot clock is a repeated signal with a relatively short period.

To control an operation timing of the scan driving unit 120 and the data driving unit 130, the timing controlling unit 160 generates the data control signal DCS for controlling the operation timing of the data driving unit 130 and the scan control signal GCS for controlling the operation timing of the scan driving unit 120 based on the plurality of timing signals. The timing controlling unit 160 outputs the scan control signal GCS to the scan driving unit 120 and outputs the digital video data DATA and the data control signal DCS to the data driving unit 130.

The host system 170 may include a navigation system, a set-top box, a DVD player, a Blu-ray player, a personal computer (PC), a home theater system, a broadcast receiver and a phone system. The host system 170 includes a system on chip (SoC) having a scaler and converts the digital video data DATA of an input image into a format suitable for the display panel 110. The host system 170 transmits the digital video data DATA and the plurality of timing signals to the timing controlling unit 160.

A plurality of first touch electrodes and a plurality of second touch electrodes as well as the plurality of data lines D1 to Dm and the plurality of scan lines S1 to Sn may be formed in the display panel 110. The plurality of first touch electrodes may cross the plurality of second touch electrodes. The plurality of first touch electrodes may be connected to a first touch driving unit 181 through a plurality of first touch lines T1 to Tj (j is a positive integer greater than or equal to 2). The plurality of second touch electrodes may be connected to a second touch driving unit 182 through a plurality of second touch lines R1 to Ri (i is a positive integer greater than or equal to 2). A touch sensor may be formed at each crossing of the plurality of first touch electrodes and the plurality of second touch electrodes. Although the touch sensor exemplarily has a mutual capacitance type in an embodiment of the present disclosure, it is not limited thereto.

The touch driving unit 180 supplies a driving pulse to the plurality of first touch electrodes through the plurality of first touch lines T1 to Tj and senses a charge change amount of each touch sensor through the plurality of second touch lines R1 to Ri. In FIG. 3, the plurality of first touch lines T1 to Tj are transmitting (Tx) lines supplying the driving pulse, and the plurality of second touch lines R1 to Ri are receiving (Rx) lines sensing the charge change amount of each touch sensor.

The touch driving unit 180 includes the first touch driving unit 181 (e.g., a circuit), the second touch driving unit 182 (e.g., a circuit) and a touch controlling unit 183 (e.g., a circuit). The first touch driving unit 181, the second touch driving unit 182 and the touch controlling unit 183 may be formed in a single read out integrated circuit (ROIC).

The first touch driving unit 181 selects a first touch line where the driving pulse is outputted according to a control of the touch controlling unit 183 and supplies the driving pulse to the selected first touch line. For example, the first touch driving unit 181 may sequentially supply the driving pulse to the plurality of first touch lines T1 to Tj.

The second touch driving unit 182 selects a second touch line where the charge change amount of the touch sensors is received according to a control of the touch controlling unit 183 and receives the charge change amount from the selected second touch line. The second touch driving unit 182 selects (sampling) the charge change amount of the touch sensors received through the plurality of second touch lines R1 to Ri and converts the selected charge change amount into a touch raw data TRD of a digital type.

The touch controlling unit 183 may generate a transmitting (Tx) setup signal for selecting the first touch line where the driving pulse is outputted from the first touch driving unit 181 and a receiving (Rx) setup signal for selecting the second touch line where a touch sensor voltage is received by the second touch driving unit 182. In addition, the touch controlling unit 183 may generate a plurality of timing control signals for controlling an operation timing of the first touch driving unit 181 and the second touch driving unit 182.

The touch coordinate calculating unit 190 receives the touch raw data TRD from the touch driving unit 180. The touch coordinate calculating unit 190 calculates touch coordinates according to a touch coordinate calculating method and outputs a touch coordinate data HIDxy including an information of the touch coordinates to the host system 170.

The touch coordinate calculating unit 190 may be formed as a micro controller unit (MCU). The host system 170 performs an application program relating to a coordinate where a touch occurs by a user by analyzing the touch coordinate data HIDxy inputted from the touch coordinate calculating unit 190. The host system 170 transmits the digital video data DATA and the plurality of timing signals to the timing controlling unit 160.

The touch driving unit 180 may be formed in the source drive ICs 131 or a separate driving chip to be mounted on the circuit board 150. In addition, the touch coordinate calculating unit 190 may be formed in a driving chip to be mounted on the circuit board 150.

The display device according to a first embodiment of the present disclosure may be illustrated with reference to FIGS. 4 to 8 hereinafter.

Figure 4:
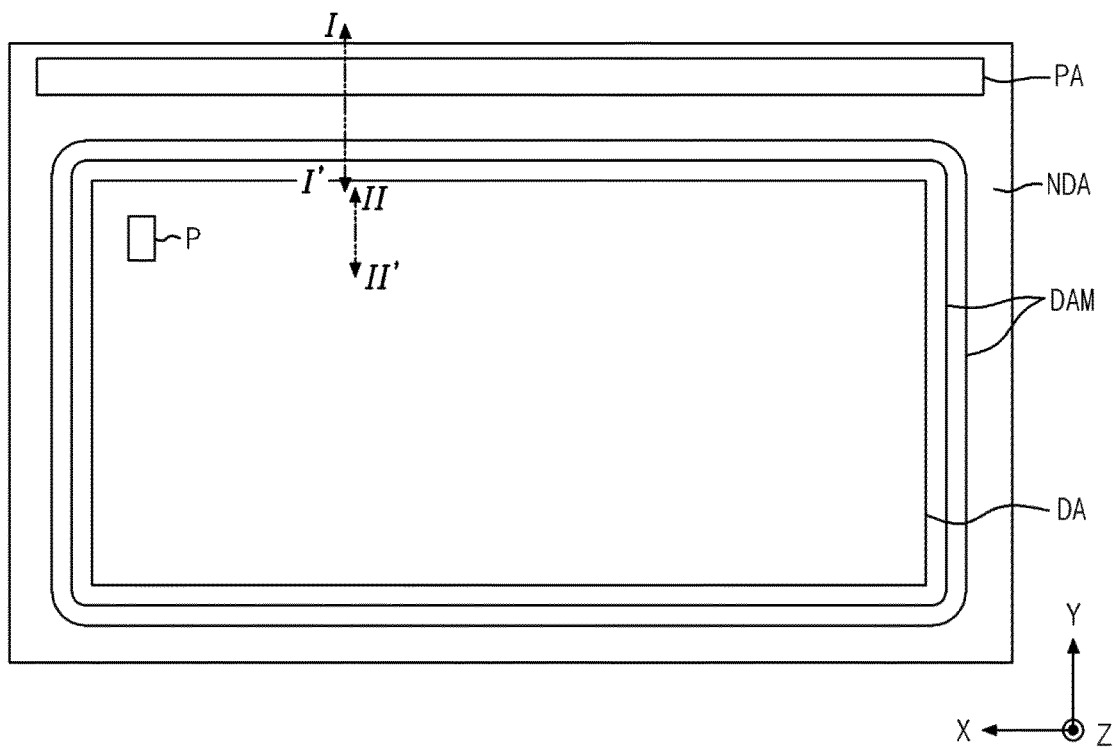
FIG. 4 is a plan view showing a display device according to the first embodiment of the present disclosure.
Figure 5:
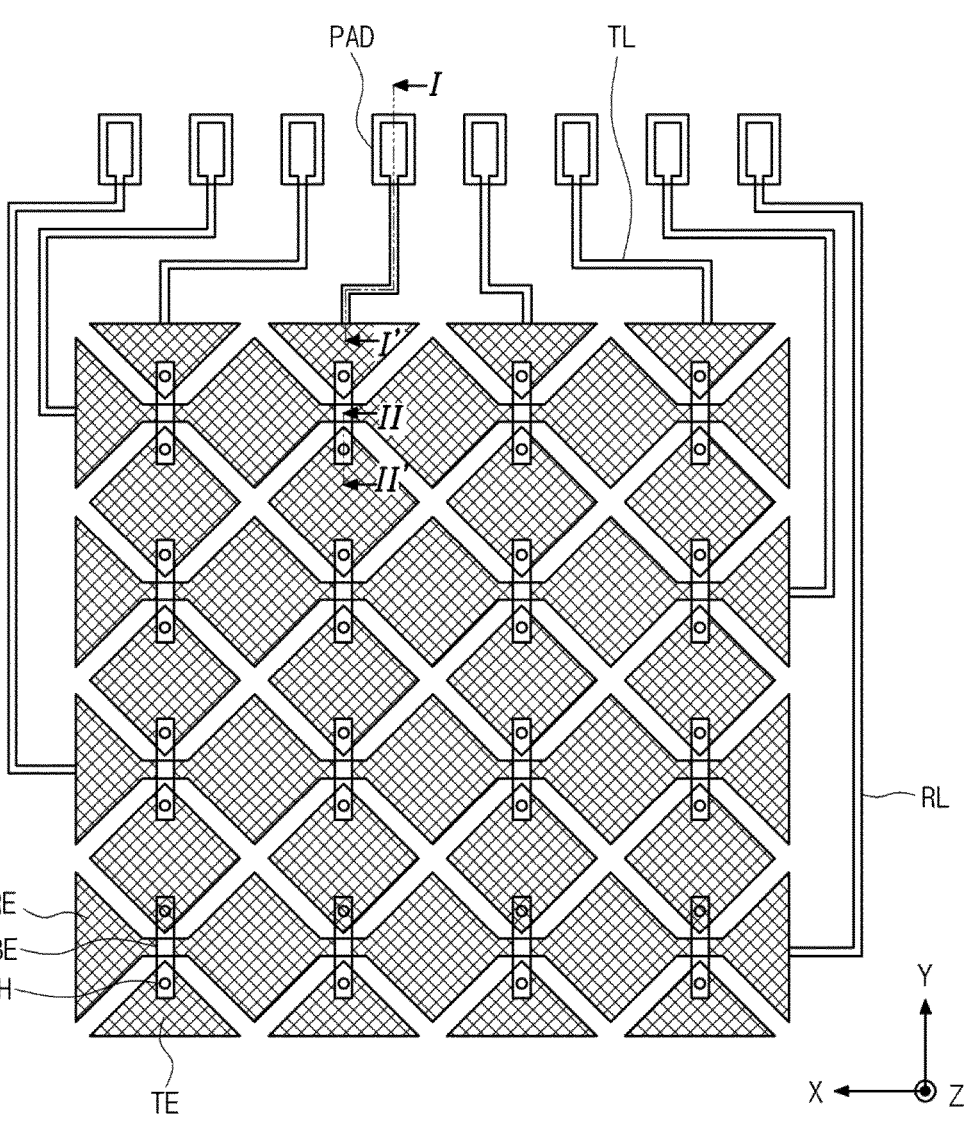
FIG. 5 is a plan view showing a touch sensing layer of a display device according to the first embodiment of the present disclosure.
Figure 6:
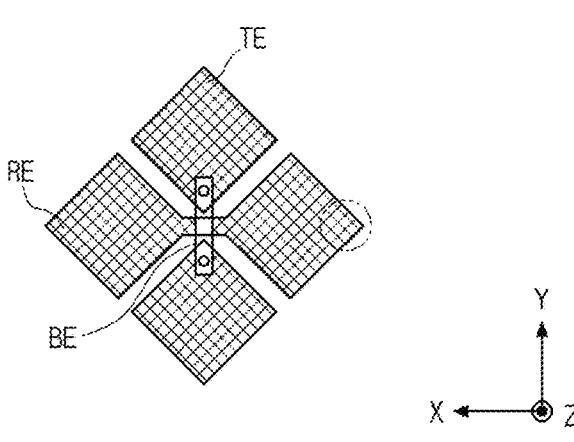
FIG. 6 is a magnified plan view showing a touch electrode of a display device according to the first embodiment of the present disclosure.
Figure 7:
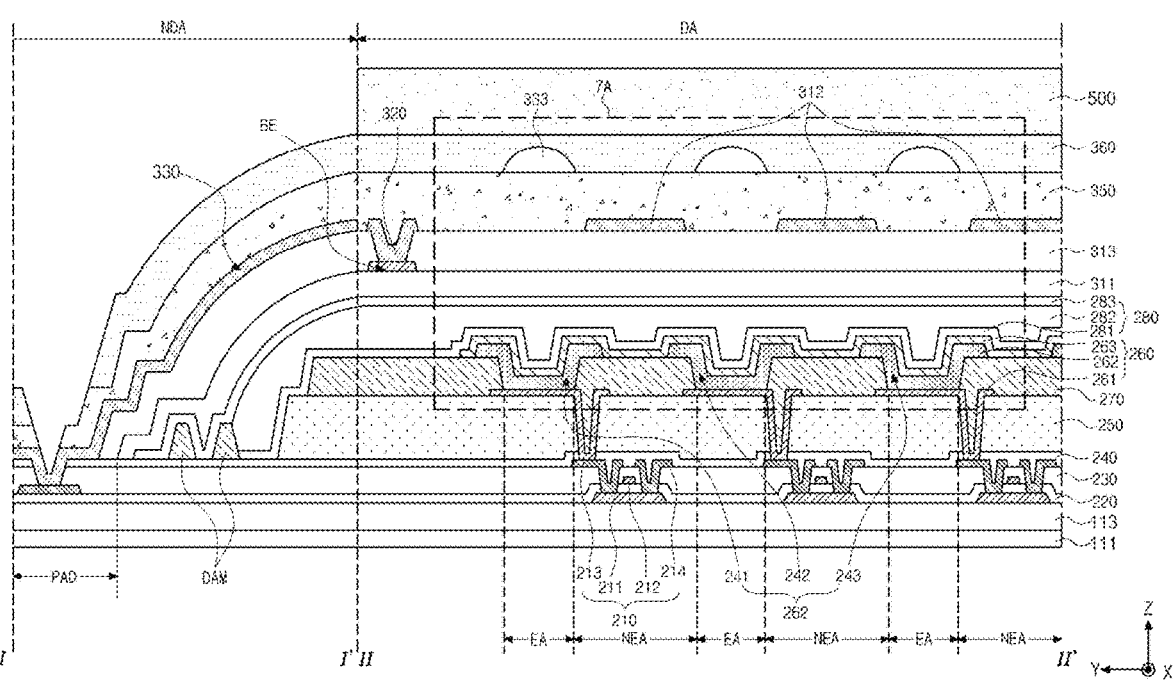
FIG. 7 is a cross-sectional view taken along lines I-I' and II-II' of FIGS. 4 and 5 according to the first embodiment of the present disclosure.
Figure 8:
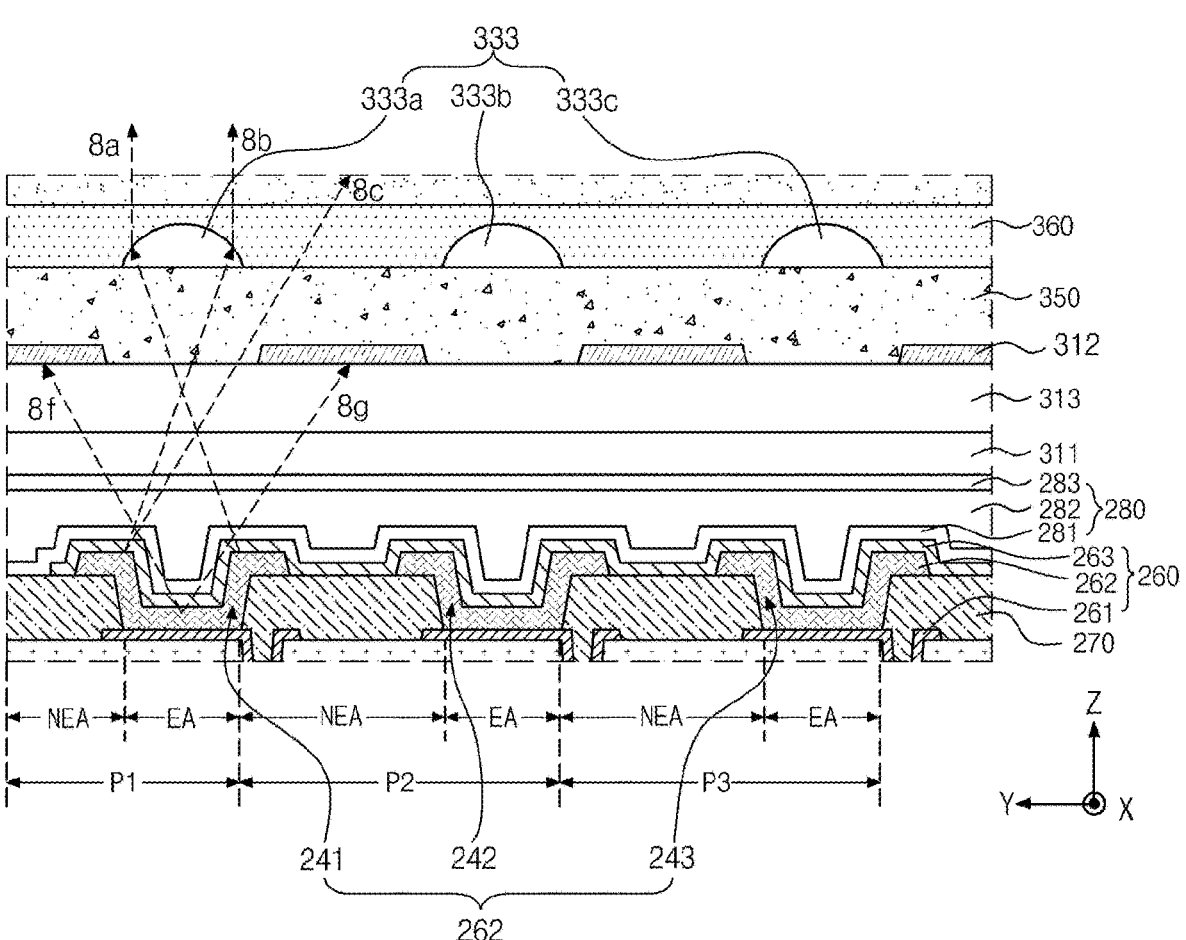
FIG. 8 is a magnified cross-sectional view of a region 7A of FIG. 7 according to the first embodiment of the present disclosure.

FIG. 4 is a plan view showing a display device according to the first embodiment of the present disclosure, FIG. 5 is a plan view showing a touch sensing layer of a display device according to the first embodiment of the present disclosure, FIG. 6 is a magnified plan view showing a touch electrode of a display device according to the first embodiment of the present disclosure, FIG. 7 is a cross-sectional view taken along lines I-I' and II-II' of FIGS. 4 and 5 according to the first embodiment of the present disclosure, and FIG. 8 is a magnified cross-sectional view of a region 7A of FIG. 7 according to the first embodiment of the present disclosure.

In FIGS. 4 to 8, a first substrate 111 may include a display area DA and a non-display area NDA. The first substrate 111 may be a glass substrate or a plastic substrate having a flexible material such as polyimide. The embodiments of the present disclosure are not limited thereto.

The non-display area NDA may include a pad area PA where pads PAD are disposed and a dam DAM is disposed in the non-display area NDA on the first substrate 111. The dam DAM may be formed to have a plurality of dams and the plurality of dams may be formed in different layers.

A thin film transistor layer and an emitting element layer (e.g., a light emitting layer) are disposed in the display area DA on the first substrate 111.

The thin film transistor layer includes a plurality of thin film transistors 210, a gate insulating layer 220, an interlayer insulating layer 230, a passivation layer 240 and a first planarizing layer 250.

A buffer layer 113 may be disposed on the first substrate 111. The buffer layer 113 is formed on the first substrate 111 to protect the plurality of thin film transistors 210 and a plurality of emitting elements 260 (e.g., light emitting elements) from moisture penetrating through the first substrate 111. The first substrate 111 may face into a second substrate 112. The buffer layer 113 may include a plurality of inorganic layers alternately laminated. For example, the buffer layer 113 may have a multiple layer including a plurality of inorganic layers of at least one of silicon oxide (SiOx), silicon nitride (SiNx) and silicon oxynitride (SiON).

A thin film transistor 210 is disposed on the buffer layer 113. The thin film transistor 210 includes an active layer 211, a gate electrode 212, a source electrode 213 and a drain electrode 214. Although the thin film transistor 210 exemplarily have a top gate type where the gate electrode 212 is disposed on the active layer 211, it is not limited thereto. The thin film transistor 210 may have a bottom gate type or a double gate type in another embodiment.

The active layer 211 is disposed on the buffer layer 113. Although the active layer 211 may include an oxide semiconductor material such as indium gallium zinc oxide (IGZO), it is not limited thereto. The active layer 211 may include low temperature polycrystalline silicon (LTPS) or amorphous silicon (a-Si) in another embodiment.

A light shielding layer (not shown) for blocking an external light incident to the active layer 211 may be disposed between the buffer layer 113 and the active layer 211.

A gate insulating layer 220 insulating the active layer 211 and the gate electrode 212 may be disposed on the active layer 211. Although the gate insulating layer 220 is exemplarily disposed on the entire first substrate 111, it is not limited thereto. The gate insulating layer 220 may be disposed only under the gate electrode 212. The gate insulating layer 220 may have an inorganic layer, for example, a single layer or a multiple layer of silicon oxide (SiOx) and silicon nitride (SiNx). The embodiments of the present disclosure are not limited thereto.

The gate electrode 212 and a gate line (not shown) may be disposed on the gate insulating layer 220. The gate electrode 212 and the gate line may have a single layer or a multiple layer of one of molybdenum (Mo), aluminum (Al), chromium (Cr), gold (Au), titanium (Ti), nickel (Ni), neodymium (Nd) and copper (Cu) and an alloy thereof. The embodiments of the present disclosure are not limited thereto.

The interlayer insulating layer 230 may be disposed on the gate electrode 212 and the gate line. The interlayer insulating layer 230 may have an inorganic layer, for example, a single layer or a multiple layer of silicon oxide (SiOx) and silicon nitride (SiNx). The embodiments of the present disclosure are not limited thereto.

The source electrode 213, the drain electrode 214 and a data line (not shown) may be disposed on the interlayer insulating layer 230. The source electrode 213 and the drain electrode 214 may be connected to the active layer 211 through contact holes in the gate insulating layer 220 and the interlayer insulating layer 230. In one embodiment, the source electrode 213 and the drain electrode 214 are made of a same material as the pads PAD. For example, the pads PAD include the same material as the source electrode 213 and the drain electrode 214. In one embodiment, the pads PAD include the same material as the gate electrode 212. The source electrode 213, the drain electrode 214 and the data line may have a single layer or a multiple layer of one of molybdenum (Mo), aluminum (Al), chromium (Cr), gold (Au), titanium (Ti), nickel (Ni), neodymium (Nd) and copper (Cu) and an alloy thereof. The embodiments of the present disclosure are not limited thereto.

The passivation layer 240 for insulating the thin film transistor 210 may be disposed on the source electrode 213, the drain electrode 214 and the data line. The passivation layer 240 may have an inorganic layer, for example, a single layer or a multiple layer of silicon oxide (SiOx) and silicon nitride (SiNx). The embodiments of the present disclosure are not limited thereto.

The first planarizing layer 250 may be disposed on the passivation layer 240 to planarize a step difference due to the thin film transistor 210. The first planarizing layer 250 may include an organic material such as acrylic resin, epoxy resin, phenolic resin, polyamide resin and polyimide resin. The embodiments of the present disclosure are not limited thereto.

The emitting element layer is disposed on the thin film transistor layer. The emitting element layer includes a plurality of emitting elements 260 and a bank layer 270.

For example, the plurality of emitting elements 260 may be disposed in the display area DA. In one embodiment, the emitting elements 260 are micro-LEDs or organic light emitting diodes (OLED).

The plurality of emitting elements 260 and the bank layer 270 are disposed on the first planarizing layer 250. The emitting element 260 of a light emitting diode includes a first electrode 261, an emitting layer 262 (e.g., a light emitting layer) and a second electrode 263. The first electrode 261 may be an anode and the second electrode 263 may be a cathode.

The first electrode 261 may be disposed on the first planarizing layer 250. The first electrode 261 is connected to the source electrode 213 of the thin film transistor 210 through a contact hole in the passivation layer 240 and the first planarizing layer 250. The first electrode 261 may include a metallic material having a relatively high reflectance and may have a laminated structure such as Ti/Al/Ti of aluminum and titanium, ITO/Al/ITO of aluminum and indium tin oxide (ITO), a silver palladium copper (AgPdCu: APC) alloy and ITO/APC/ITO of APC alloy and ITO. The embodiments of the present disclosure are not limited thereto.

The bank layer 270 may be disposed on the first planarizing layer 250 to cover an edge portion of the first electrode 261 for defining the subpixel P. For example, the bank layer 270 may be referred to as a pixel defining layer. For example, the bank layer 270 may be disposed to have a plurality of openings, and each opening may correspond to an emitting area EA of each emitting element 260.

The bank layer 270 may include an organic material such as acrylic resin, epoxy resin, phenolic resin, polyamide resin and polyimide resin. The embodiments of the present disclosure are not limited thereto. In one embodiment, the bank layer 270 includes black material such as a black matrix or black resin or dye. For example, the bank layer 270 may have a same material as the light absorbing pattern 317 further described below.

The emitting layer 262 is disposed on the first electrode 261 and the bank layer 270. The emitting layer 262 may include a hole transporting layer, at least one emitting material layer and an electron transporting layer. The embodiments of the present disclosure are not limited thereto. When a voltage is applied to the first electrode 261 and the second electrode 263, a hole and an electron move to the emitting material layer through the hole transporting layer and the electron transporting layer, respectively, and the hole and the electron are combined in the emitting material layer to emit a light.

The emitting layer 262 may have a white emitting layer emitting a white colored light. Alternatively, the emitting layer 262 may have a red emitting layer emitting a red colored light, a green emitting layer emitting a green colored light and a blue emitting layer emitting a blue colored light. The emitting layer 262 may be disposed to cover the first electrode 261 and the bank layer 270.

The second electrode 263 is disposed on the emitting layer 262. When the display device 100 has a top emission type, the second electrode 263 may include a transparent conductive oxide (TCO) such as indium tin oxide (ITO) and indium zinc oxide (IZO) or a semi-transmissive conductive material such as magnesium (Mg), silver (Ag) and an alloy thereof to transmit a light. The embodiments of the present disclosure are not limited thereto.

An encapsulating layer 280 is disposed on the plurality of emitting elements 260 to cover the plurality of emitting elements 260. The encapsulating layer 280 extends from the display area DA to the non-display area NDA.

The encapsulating layer 280 may prevent or at least reduce penetration of an oxygen or a moisture to the emitting layer 262 and the second electrode 263. The encapsulating layer 280 may include at least one inorganic layer and at least one organic layer. For example, the encapsulating layer 280 may include a first inorganic encapsulating layer 281, an organic encapsulating layer 282 and a second inorganic encapsulating layer 283.

The first inorganic encapsulating layer 281 may be disposed on the second electrode 263. The first inorganic encapsulating layer 281 may be formed to cover the second electrode 263. The organic encapsulating layer 282 may be disposed on the first inorganic encapsulating layer 281. The organic encapsulating layer 282 may have a predetermined thickness to prevent or at least reduce penetration of particles to the emitting layer 262 and the second electrode 263 through the first inorganic encapsulating layer 281. The second inorganic encapsulating layer 283 may be disposed on the organic encapsulating layer 282. The second inorganic encapsulating layer 283 may be formed to cover the organic encapsulating layer 282.

The first and second inorganic encapsulating layers 281 and 283 may include one of silicon nitride, aluminum nitride, zirconium nitride, titanium nitride, hafnium nitride, tantalum nitride, silicon oxide, aluminum oxide and titanium oxide. The embodiments of the present disclosure are not limited thereto.

The organic encapsulating layer 282 may include one of acrylic resin and epoxy resin.

The display device 100 may include the dam DAM having a closed curve shape in the non-display area NDA to surround the organic encapsulating layer 282. The dam DAM may be disposed to surround an edge portion of the display area DA and may block a flow of the organic encapsulating layer 282. As a result, the dam DAM may prevent that the organic encapsulating layer 282 is exposed outside the display device 100 or the organic encapsulating layer 282 intrudes the pad area PA.

Although the dam DAM may include a single dam, the flow of the organic encapsulating layer 282 may be effectively blocked by a plurality of dams. Although two dams DAM are exemplarily disposed in FIG. 7, it is not limited thereto.

The dam DAM may be simultaneously formed with the first planarizing layer 250 or the bank layer 270 of the subpixel P and may include the same material as the first planarizing layer 250 or the bank layer 270 of the subpixel P. In one embodiment, the dam DAM may include organic material.

The second inorganic encapsulating layer 283 may be disposed to cover the dam DAM.

The touch sensing layer is disposed on the encapsulating layer 280. The touch sensing layer may include a plurality of touch electrodes 320 having a plurality of first touch electrodes TE and a plurality of second touch electrodes RE, a plurality of bridge electrodes BE, a touch buffer layer 311 and an insulating layer 313.

The touch buffer layer 311 is disposed on the encapsulating layer 280 in the display area DA to expose the pad PAD in the non-display area NDA. The touch buffer layer 311 may be formed to cover the dam DAM.

The touch buffer layer 311 may block or at least reduce penetration of a solution such as a developer or an etchant used in a fabrication process of the plurality of touch electrodes on the touch buffer layer 311 or a particle such as an external moisture to the emitting element of an organic material.

The plurality of bridge electrodes BE are disposed on the touch buffer layer 311. The plurality of bridge electrodes BE is disposed in the display area DA and electrically connect the plurality of first touch electrodes TE on the insulating layer 313.

To prevent an electric shortage of the plurality of first touch electrodes TE and the plurality of second touch electrodes RE at crossing thereof, as shown in FIG. 5, the first touch electrodes TE adjacent to each other along a first direction (y axis direction) are electrically connected to each other through the bridge electrode BE. The plurality of bridge electrodes BE may be disposed in a different layer from the plurality of first touch electrodes TE and the plurality of second touch electrodes RE and may be connected to the adjacent first touch electrodes TE through contact holes CH. The plurality of bridge electrodes BE may cross the plurality of second touch electrodes RE.

The contact holes CH may be formed in the insulating layer 313. The plurality of bridge electrodes BE are disposed under the insulating layer 313 to be exposed through the two contact holes CH. As a result, one bridge electrode BE is connected to adjacent two first touch electrodes TE.

The insulating layer 313 is disposed on the touch buffer layer 311 to cover the plurality of bridge electrodes BE. The insulating layer 313 may insulate the plurality of bridge electrodes BE and the plurality of second touch electrodes RE. The insulating layer 313 may be disposed between the plurality of bridge electrodes BE to insulate the plurality of bridge electrodes BE.

The insulating layer 313 extends from the display area DA to the non-display area NDA. The insulating layer 313 may be formed to cover the dam DAM such that a step difference due to the dam DAM is reduced.

The plurality of touch electrodes 320 of a mesh shape are disposed on the insulating layer 313. The plurality of touch electrodes 320 includes the plurality of first touch electrodes TE and the plurality of second touch electrodes RE.

The plurality of first touch electrodes TE and the plurality of second touch electrodes RE are disposed in the display area DA. The plurality of first touch electrodes TE are disposed along the first direction (y axis direction) to be connected to each other, and the plurality of second touch electrodes RE are disposed along a second direction (x axis direction) to be connected to each other. The first direction (y axis direction) may be a direction parallel to the plurality of scan lines S1 to Sn, and the second direction (x axis direction) may be a direction parallel to the plurality of data lines D1 to Dm. Alternatively, the first direction (y axis direction) may be a direction parallel to the plurality of data lines D1 to Dm, and the second direction (x axis direction) may be a direction parallel to the plurality of scan lines S1 to Sn.

A line of the plurality of first touch electrodes TE connected along the first direction (y axis direction) is electrically insulated from an adjacent line of the plurality of first touch electrodes TE along the second direction (x axis direction). A line of the plurality of second touch electrodes RE connected along the second direction (x axis direction) is electrically insulated from an adjacent line of the plurality of second touch electrodes RE along the first direction (y axis direction).

As a result, a mutual capacitance of the touch sensor may be formed at crossing of the first touch electrode TE and the second touch electrode RE.

For example, as shown in FIG. 6, the plurality of touch electrodes 320 may have a mesh shape having openings.

Since the plurality of touch electrodes 320 have a mesh shape and the plurality of emitting elements 260 correspond to the openings of the plurality of touch electrodes 320, a light extraction efficiency may be improved.

The plurality of touch electrodes 320 may be disposed to correspond to the bank layer 270. That is, the plurality of touch electrodes 320 overlap the bank layer 270. The bank layer 270 has the plurality of openings and the plurality of openings of the bank layer 270 correspond to the emitting area EA. The openings of the plurality of touch electrodes 320 may be disposed to correspond to the plurality of openings of the bank layer 270.

Accordingly, the plurality of touch electrodes 320 may be disposed along the bank layer 270 to correspond to the bank layer 270. Since the plurality of touch electrodes 320 are disposed to correspond to the bank layer 270 and the openings of the plurality of touch electrodes 320 are disposed to correspond to the emitting area EA, the openings of the plurality of touch electrodes 320 may overlap the emitting area EA and a reduction of an emission efficiency may be minimized.

The pad PAD is disposed in the non-display area NDA, and a touch routing line 330 may be disposed on the insulating layer 313 to electrically connect the pad PAD and the plurality of touch electrodes 320.

The pad PAD may be formed of the same material and in the same layer as the gate electrode 212, and the touch routing line 330 may be formed of the same material and in the same layer as the plurality of touch electrodes 320.

In FIGS. 7 and 8, a first barrier layer 312 may be disposed on the insulating layer 313 to correspond to a non-light emitting area NEA in the display area DA. The first barrier layer 312 may be a layer blocking a light of a viewing angle direction and focusing a light toward a front direction of the display panel. The front direction may be a direction perpendicular (e.g., normal) to the display surface of the display panel in one embodiment. As shown in FIGS. 7 and 8, one or more intermediate layers (e.g., encapsulating layer 280, touch buffer layer 311, and insulating layer 313) may be between the first barrier layer 312 and the light emitting element 260. The first barrier layer 312 may include a metallic material or a material absorbing a light. The metallic material may be configured to reflect light. The first barrier layer 312 may include the same material as the plurality of touch electrodes 320. In one embodiment, the first barrier layer 312 is a portion of the touch electrodes 320 that are disposed in the mesh shape. Thus, the touch electrodes 320 are configured to block light of a viewing angle direction and focus the light toward the front direction of the display panel since the touch electrodes 320 function as a barrier layer as well as sense touch of the display panel. The embodiments of the present disclosure are not limited thereto. Since the plurality of touch electrodes 320 are utilized as the first barrier layer 312, a fabrication time and a fabrication cost may be reduced without an additional process. The first barrier layer 312 may block a light 8f and 8g (of FIG. 8) of a viewing angle direction other than a front direction.

As a result, the display device 100 according to the first embodiment of the present disclosure may control or cut off an up and down viewing angle without attaching a separate light control film on the display panel 110. In one embodiment, the up and down viewing angle is a polar angle along the Y-axis direction with respect to the front direction.

A first protecting layer 350 covering the plurality of touch electrodes 320 and the touch routing line 330 may be disposed on the first barrier layer 312.

A plurality of lenses 333 corresponding to the plurality of emitting areas EA, respectively, may be disposed on the first protecting layer 350. That is, each lens 333 overlaps a corresponding emission area EA from the plurality of emission areas EA. A second protecting layer 360 may be disposed on the plurality of lenses 333. The first protecting layer 350 and the second protecting layer 360 may be formed to expose the pad PAD in the non-display area NDA.

The plurality of lenses 333 may be disposed on the plurality of emitting elements 260 so as to overlap the plurality of emitting elements 260. As shown in FIGS. 7 and 8, the first barrier layers 312 are closer to the substrate 111 than the plurality of lenses 333. The plurality of lenses 333 may be disposed on first barrier layer 312 and overlap the emitting area EA. Each lens 333 may extend along the first direction (y axis direction) to have a size equal to or greater than each emitting element 260. The plurality of lenses 333 may be disposed parallel to each other along the first direction (y axis direction). For example, the first direction (y axis direction) may be a short axis direction, a vertical direction or an up and down direction in a display device of rectangular shape of 16:9.

In FIG. 8, the plurality of lenses 333a, 333b and 333c configured to refract light are disposed to correspond to the plurality of emitting areas EA of the plurality of subpixels P1, P2 and P3.

The plurality of lenses 333a, 333b and 333c may be disposed to correspond to the plurality of subpixels P1, P2 and P3. For example, a first lens 333a is disposed to correspond to the emitting area EA of a first subpixel P1, a second lens 333b is disposed to correspond to the emitting area EA of a second subpixel P2, and a third lens 333c is disposed to correspond to the emitting area EA of a third subpixel P3. That is, the first lens 333a overlaps the first subpixel P1, the second lens 333b overlaps the second subpixel P2, and third lens 333c overlaps the third subpixel P3.

For example, the plurality of lenses 333a, 333b and 333c may be a convex lens having a semispherical shape convex toward a polarizing plate 500 along a third direction (z axis direction).

Figure 9:
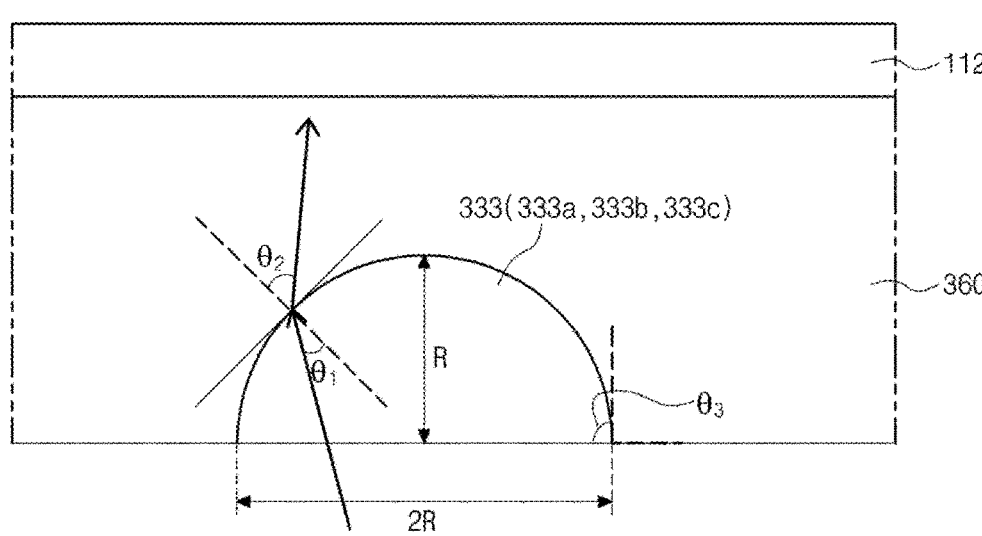
FIG. 9 is a magnified cross-sectional view showing a lens of FIG. 7 according to the first embodiment of the present disclosure.

FIG. 9 is a magnified cross-sectional view showing a lens of FIG. 7 according to the first embodiment.

In FIG. 9, when a light is incident to the plurality of lenses 333a, 333b and 333c from the emitting layers 241, 242 and 243, the light is refracted to have a refraction angle $\theta2$ greater than an incidence angle $\theta1$ ($\theta1 < \theta2$). Since an incidence angle of the light passing through the plurality of lenses 333a, 333b and 333c to the second substrate 112 is reduced, the light may not be totally reflected. As a result, the display device 100 according to a first embodiment of the present disclosure may have an excellent light extraction efficiency.

The plurality of lenses 333a, 333b and 333c may focus a light 8a and 8b of a front direction of the display device 100 among the light emitted from the emitting element 260.

A refractive index of the plurality of lenses 333 may be greater than a refractive index of the second protecting layer 360. Since the refractive index of the second protecting layer 360 is less than the refractive index of the plurality of lenses 333, a focusing efficiency of a light of a front direction and a light extraction efficiency may be improved.

Since the refractive index of the plurality of lenses 333 is greater than the refractive index of the second protecting layer 360, a focusing effect that the light incident to each lens 333 is refracted toward a thick portion of each lens 333 is obtained and a luminance of a front direction is improved. Since the light is transmitted from a medium of a relatively high refractive index to a medium of a relatively low refractive index, the light is not leaked and the luminance of a front direction increases.

For example, the lens 333 may have a refractive index in a range of 1.5 to 1.8, and the second protecting layer 360 may have a refractive index in a range of 1.3 to 1.5. As a refractive index difference increases, a focusing efficiency of a light of a front direction increases.

The lens 333 may be disposed to include the emitting area EA of the emitting element 260. When the lens 333 has a size smaller than the emitting area EA, an amount of a light passing through the lens 333 decreases, and the focusing efficiency of the lens 333 and the light extraction efficiency are reduced.

When the lens 333 has a size greater than the emitting area EA, a curvature radius R of the lens 333 increases, and a power of the lens 333 decreases. As a result, the focusing efficiency of the lens 333 is reduced.

As a result, the lens 333 may have a size such that a power of the lens 333 increases by reducing the curvature radius R and a focusing efficiency is maximized by making the light emitted from the emitting area EA pass through the lens 333.

Although the lens 333 may include photoacryl (PAC) which can be formed through a relative low temperature process lower than about 100 degrees, it is not limited thereto. For example, the lens 333 may include polytriazine or polytriazine having at least one of titanium oxide (TiO2), zirconium oxide (ZrO2) and nano-filler.

The lens 333 may be formed to have a convex shape through an exposure process.

The emitting element 260 is disposed under the lens 333 so as to overlap the lens 333. When the lens 333 is formed through a relatively high temperature process, the emitting element 260 may be damaged during the relatively high temperature process. As a result, the lens 333 includes a material which can be formed through a relatively low temperature process lower than about 100 degrees, and the damage of the emitting element 260 during the process of forming the lens 333 is reduced.

The lens 333 may be formed through the following process. A lens layer is coated on the first protecting layer 350. The first protecting layer 350 may include photoacryl. The lens layer may include polytriazine or polytriazine having at least one of titanium oxide (TiO2), zirconium oxide (ZrO2) and nano-filler for a relatively low temperature process.

After the lens layer is coated, an edge bead removal process of removing an edge portion is performed. Next, a pre-bake process of removing a solvent in the lens layer is performed. Next, an exposure process in which the lens layer is exposed to a light through a mask to cause a photoreaction is performed.

Next, a develop process, a rinse process and a cure process are performed to form the lens 333.

The second protecting layer 360 is disposed on the lens 333 to cover the lens 333. Since the refractive index of the second protecting layer 360 is less than the refractive index of the lens 333, a focusing efficiency of a light and a light extraction efficiency may further increase due to a refractive index difference at an interface of the lens 333.

The display device 100 according to a first embodiment of the present disclosure may further include the polarizing plate 500 on the second protecting layer 360. A reflection of an external light may be reduced due to the polarizing plate 500.

Figure 10:
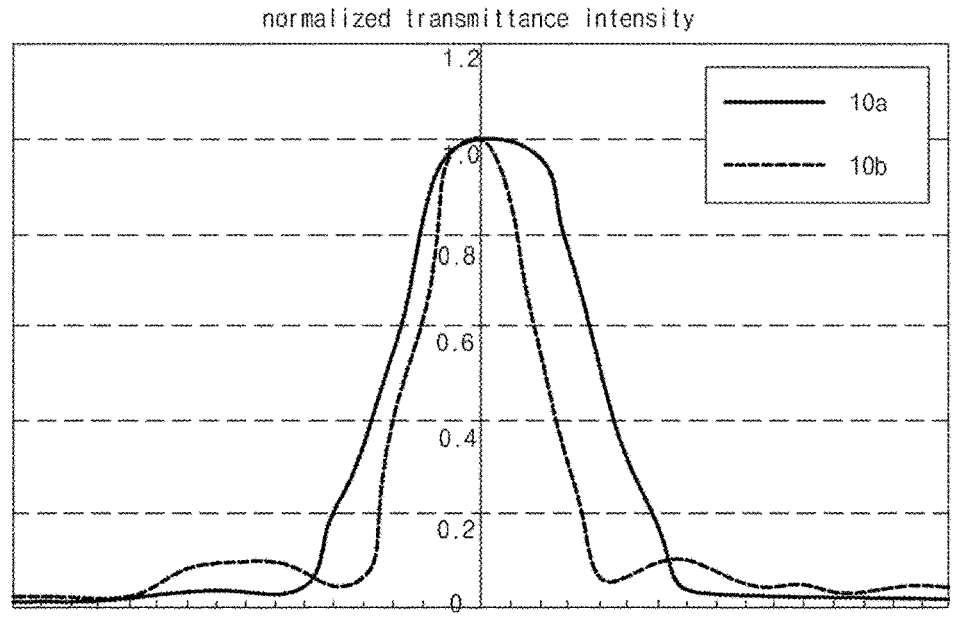
FIG. 10 is a graph showing a normalized transmittance intensity with respect to an up and down viewing angle of a display device according to the first embodiment of the present disclosure.

FIG. 10 is a graph showing a normalized transmittance intensity with respect to an up and down viewing angle of a display device according to the first embodiment of the present disclosure.

In FIG. 10, a display device according to a comparison example (10a) does not include a lens 333 and a first barrier layer 312 and includes a light control film on a display panel. A display device according to a first embodiment (10b) includes a lens 333 and a first barrier layer 312 and does not include a light control film.

The up and down viewing angle of the display device according to a first embodiment (10b) is less than the up and down viewing angle of the display device according to a comparison example (10a). Although the display device according to a comparison example (10a) has the up and down viewing angle (e.g., a viewing angle range) of about ±35 degrees, the display device according to a first embodiment (10b) has the up and down viewing angle of about ±20 degrees. As a result, the up and down viewing angle of the display device is improved.

Figure 11:
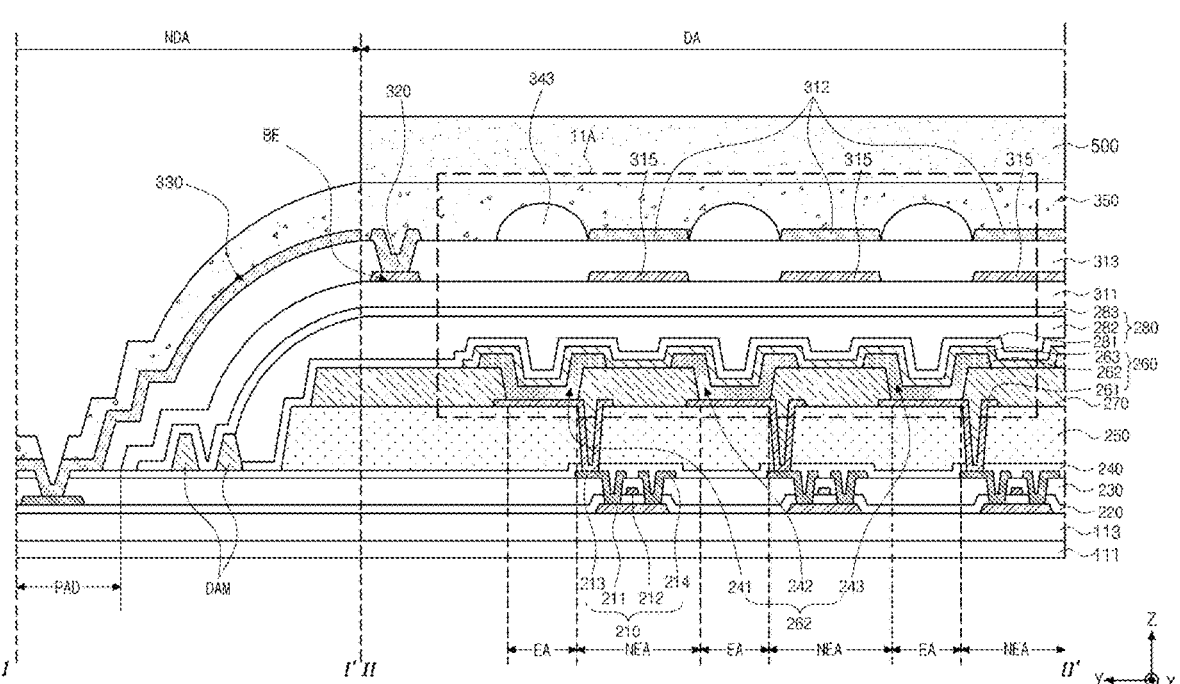
FIG. 11 is a cross-sectional view showing a display device according to a second embodiment of the present disclosure.
Figure 12:
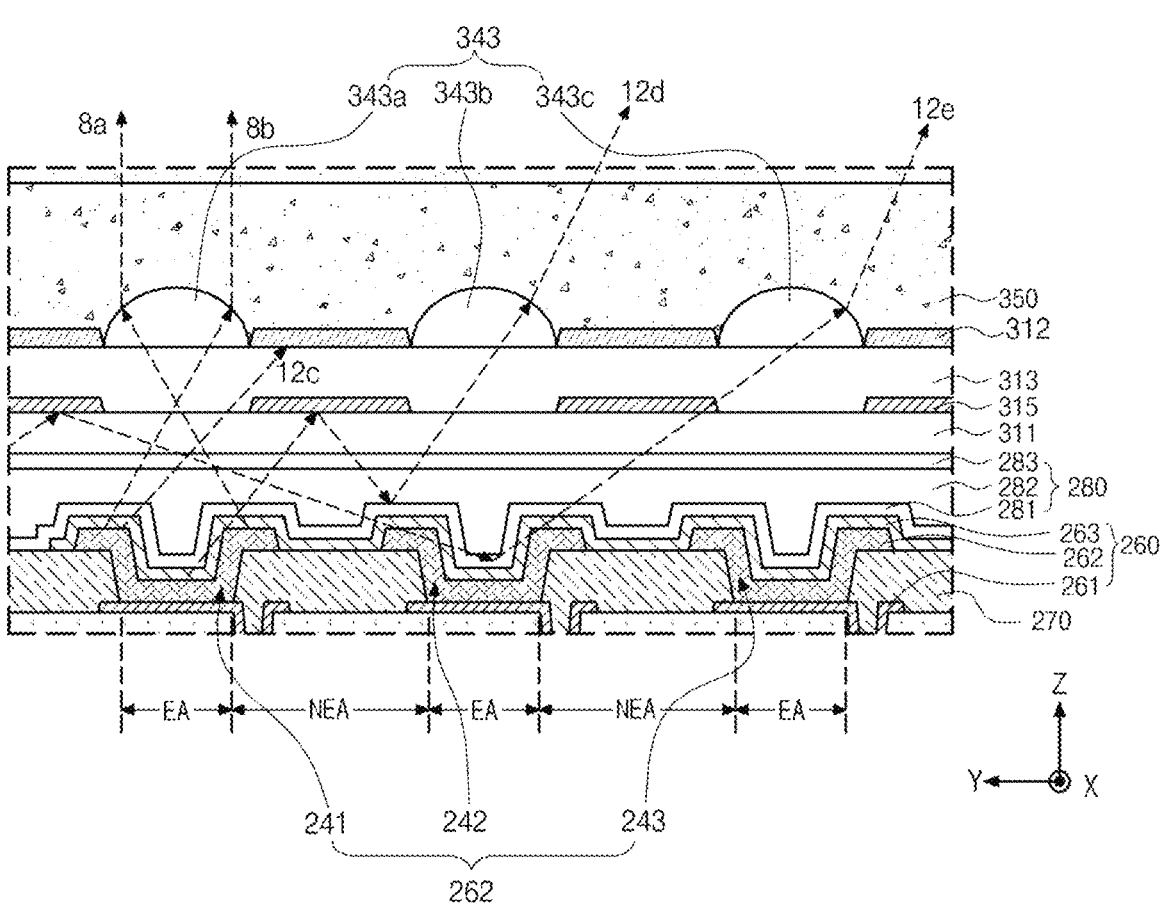
FIG. 12 is a magnified cross-sectional view of a region 11A of FIG. 11 according to the second embodiment of the present disclosure.

FIG. 11 is a cross-sectional view showing a display device according to a second embodiment of the present disclosure, and FIG. 12 is a magnified cross-sectional view of a region 11A of FIG. 11 according to the second embodiment of the present disclosure. FIG. 11 corresponds to lines I-I' and II-II' of FIGS. 4 and 5.

Illustration on parts of the second embodiment the same as those of the first embodiment may be omitted, and the parts of the first embodiment may be intactly applied to those of the second embodiment.

In FIGS. 11 and 12, a second barrier layer 315 may be disposed on the encapsulating layer 280 or on the touch buffer layer 311. The second barrier layer 315 may be a layer blocking a light of a viewing angle direction and focusing a light of a front direction. The second barrier layer 315 may include a metallic material or a material absorbing a light. The metallic material may be reflective. The insulating layer 313 may be disposed on the second barrier layer 315. The first barrier layer 312 and the lens 343 are disposed on the insulating layer 313. The first barrier layer 312 may be disposed between the plurality of lenses 343a, 343b and 343c. For example, the plurality of lenses 343a, 343b and 343c may be disposed to correspond to the emitting area EA. The plurality of lenses 343a, 343b and 343c may be disposed to be non-overlapping with the second barrier layer 315 and overlap the emitting area EA. The first barrier layer 312 and the second barrier layer 315 may be disposed in the non-light emitting area NEA that is disposed between a pair of emission areas EA. As shown in FIGS. 11 and 12, a first barrier layer 312 is between a pair of lenses 343. The first barrier layer 312 and the second barrier layer 315 may include a metallic material. In one embodiment, the first barrier layer 312 and the second barrier layer 315 include different materials. The first barrier layer 312 may include the same material as the plurality of touch electrodes 320 as the first barrier layer 312 is a portion of the touch electrodes 320 (e.g., first touch electrodes) that are disposed in the mesh shape as previously described above with respect to FIGS. 7 and 8. The embodiments of the present disclosure are not limited thereto. The second barrier layer 315 may include the same material as the plurality of bridge electrodes BE. In one embodiment, the second barrier layer 315 is a portion of the touch electrodes 320 (e.g., second touch electrodes) that are disposed in the mesh shape as previously described above with respect to FIGS. 7 and 8. The embodiments of the present disclosure are not limited thereto. The insulating layer 313 may be disposed on the second barrier layer 315. The first barrier layer 312 may be disposed on the insulating layer 313 in the non-light emitting area NEA. A fabrication time and a fabrication cost may be reduced without an additional process since the first barrier layer 312 is the touch electrodes 320 and the second barrier layer 315 is made of a same material as the bridge electrodes BE. The second barrier layer 315 may block a light 8f and 8g (of FIG. 8) of a viewing angle direction. Since the first barrier layer 312 and the second barrier layer 315 are disposed to correspond to the non-light emitting area NEA, a leakage light 12c between the lenses 343 may be blocked.

Accordingly, the display device according to the second embodiment of the present disclosure may control or cut off an up and down viewing angle without attaching a separate light control film on the display panel.

A protecting layer 350 may be disposed on the first barrier layer 312, the plurality of lenses 343, the plurality of touch electrodes 320 and the touch routing line 330.

The plurality of lenses 343a, 343b and 343c may be disposed on the insulating layer 313 to correspond to the plurality of emitting areas EA, respectively. The protecting layer 350 may be disposed on the plurality of lenses 343.

The protecting layer 350 may be formed to expose the pad PAD in the non-display area NDA.

The plurality of lenses 343 may be disposed on the plurality of emitting elements 260. Each lens 343 may extend along the first direction (y axis direction) to have a size equal to or greater than each emitting element 260. The plurality of lenses 343 may be disposed parallel to each other along the first direction (y axis direction). For example, the first direction (y axis direction) may be a short axis direction, a vertical direction or an up and down direction in a display device of rectangular shape of 16:9.

Since the focusing of a light of the plurality of lenses 343 of a second embodiment is the same as that of a first embodiment, illustration on the focusing of a light of the plurality of lenses 343 may be omitted.

The display device according to a second embodiment of the present disclosure may further include the polarizing plate 500 on the protecting layer 350. A reflection of an external light may be reduced due to the polarizing plate 500.

Figure 13:
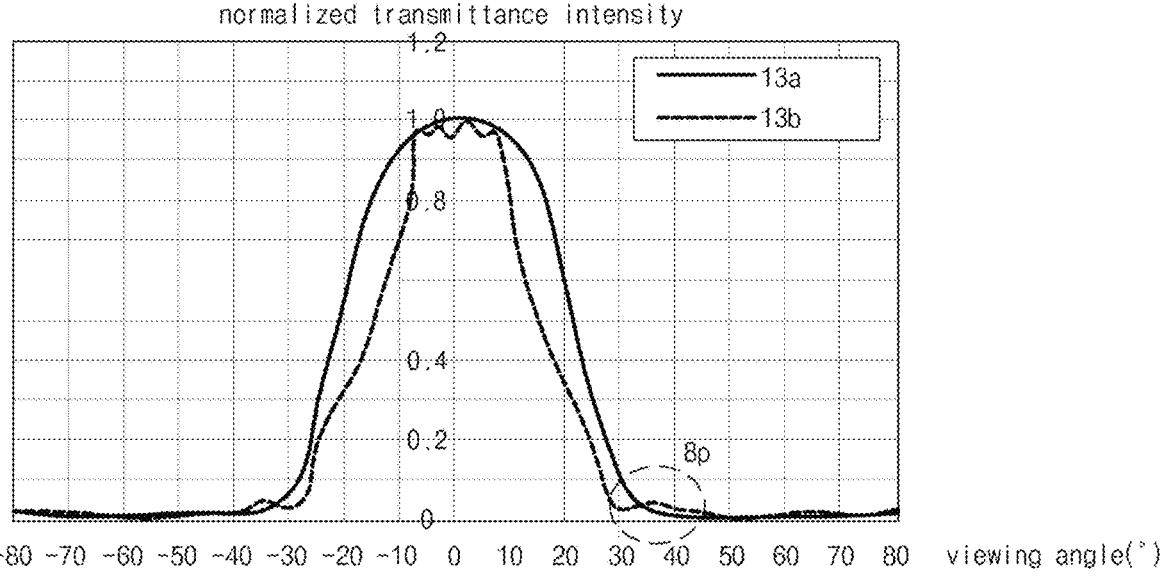
FIG. 13 is a graph showing a normalized transmittance intensity with respect to an up and down viewing angle of a display device according to the second embodiment of the present disclosure.

FIG. 13 is a graph showing a normalized transmittance intensity with respect to an up and down viewing angle of a display device according to the second embodiment of the present disclosure.

In FIG. 13, a display device according to a comparison example (13a) does not include a lens 343, a first barrier layer 312 and a second barrier layer 315 and includes a light control film on a display panel. A display device according to a second embodiment (13b) includes a lens 343, a first barrier layer 312 and a second barrier layer 315 and does not include a light control film.

The up and down viewing angle of the display device according to the second embodiment (13b) is less than the up and down viewing angle of the display device according to a comparison example (13a). Although the display device according to a comparison example (13a) has the up and down viewing angle of about ±35 degrees, the display device according to a second embodiment (13b) has the up and down viewing angle of about ±30 degrees. As a result, the up and down viewing angle of the display device is improved.

Figure 14:
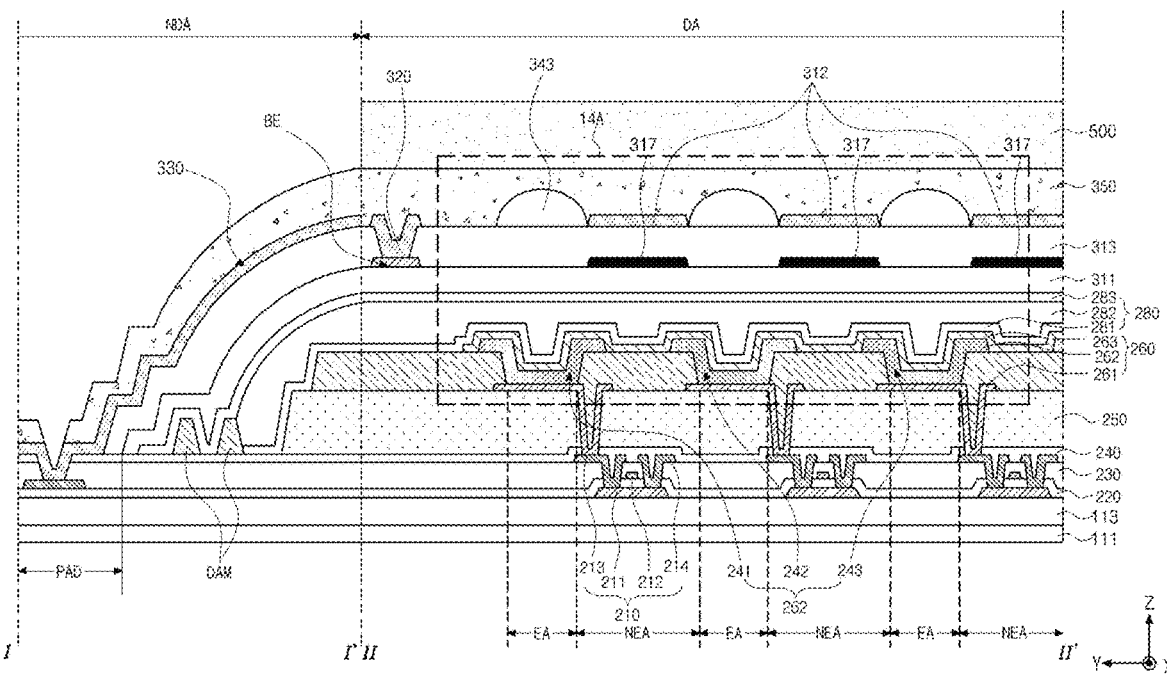
FIG. 14 is a cross-sectional view showing a display device according to a third embodiment of the present disclosure.
Figure 15:
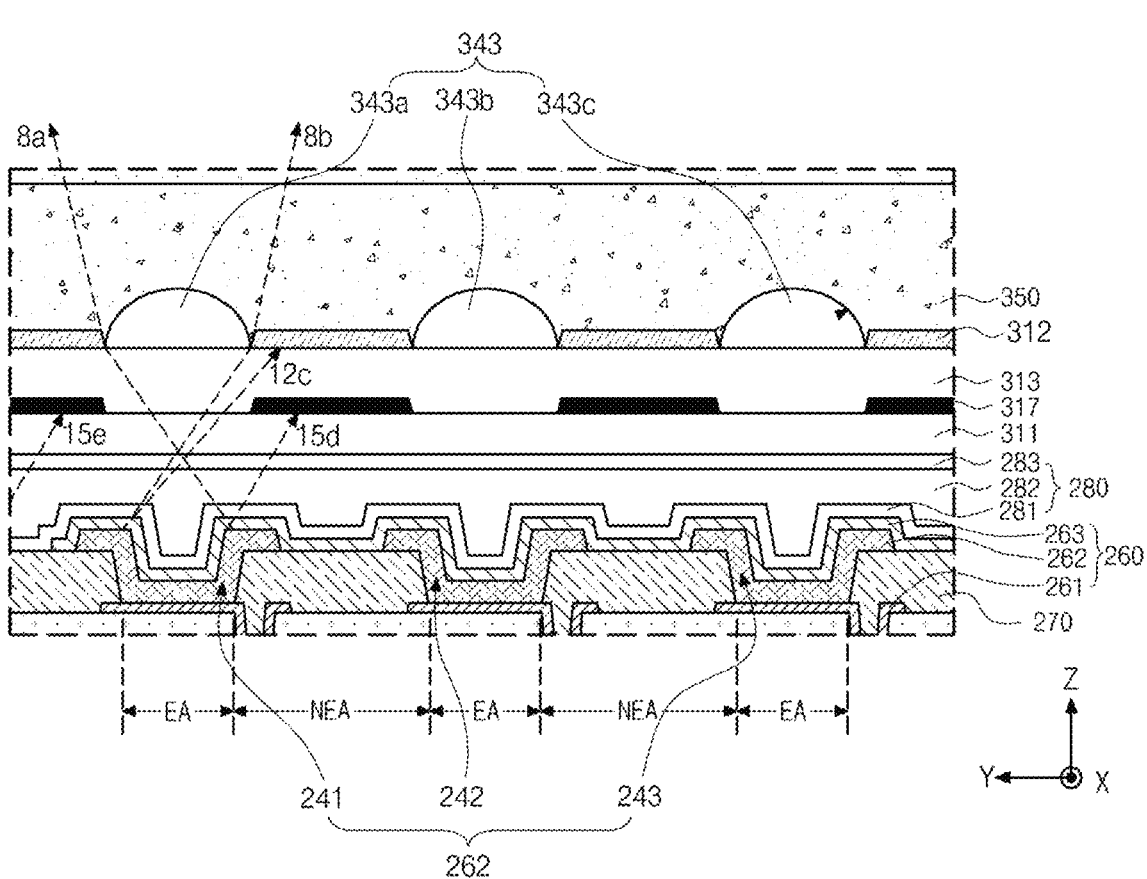
FIG. 15 is a magnified cross-sectional view of a region 14A of FIG. 14 according to the third embodiment of the present disclosure.

FIG. 14 is a cross-sectional view showing a display device according to a third embodiment of the present disclosure, and FIG. 15 is a magnified cross-sectional view of a region 14A of FIG. 14 according to the third embodiment of the present disclosure. FIG. 14 corresponds to lines I-I' and II-II' of FIGS. 4 and 5.

Illustration on parts of the third embodiment the same as those of the first embodiment may be omitted, and the parts of the first embodiment may be intactly applied to those of the third embodiment.

In FIGS. 14 and 15, a light absorbing pattern 317 may be disposed on the encapsulating layer 280 or on the touch buffer layer 311. The light absorbing pattern 317 may be a black matrix of black resin or dye. The embodiments of the present disclosure are not limited thereto. The light absorbing pattern 317 may be referred to as a second barrier layer. The insulating layer 313 may be disposed on the light absorbing pattern 317. The first barrier layer 312 and the lens 343 may be disposed on the insulating layer 313. The first barrier layer 312 may be disposed between the plurality of lenses 343a, 343b and 343c. For example, the plurality of lenses 343a, 343b and 343c may be disposed to correspond to (e.g., overlap) the emitting area EA. The first barrier layer 312 and the light absorbing pattern 317 may be disposed in the non-light emitting area NEA. The first barrier layer 312 may include the same material as the plurality of touch electrodes 320. The embodiments of the present disclosure are not limited thereto. Since the light absorbing pattern 317 is disposed to correspond to the non-light emitting area NEA, a leakage light 12c between the lenses 343 may be blocked. When the light absorbing pattern 317 is not disposed, a first reflection light 12d (of FIG. 12) reflected on the second barrier layer 315 and a second reflection light 12e (of FIG. 12) reflected on the source electrode 213 and the drain electrode 214 may pass through the plurality of lenses 343. When the light absorbing pattern 317 is disposed to correspond to the non-light emitting area NEA, the first reflection light 15e and the second reflection light 15d may be blocked by the light absorbing pattern 317.

As a result, when the light absorbing pattern 317 of a black material is disposed to correspond to the non-light emitting area NEA, reflection on the inner metal layer may be reduced and a leakage light through the lenses 343 may be prevented.

Although not shown, only the light absorbing pattern 317 may be disposed on the touch buffer layer 311 and the first barrier layer 312 may not be disposed on the touch buffer layer 311. The embodiments of the present disclosure are not limited thereto.

A protecting layer 350 may be disposed on the first barrier layer 312, the plurality of lenses 343, the plurality of touch electrodes 320 and the touch routing line 330.

The plurality of lenses 343a, 343b and 343c may be disposed on the insulating layer 313 to correspond to the plurality of emitting areas EA, respectively. The protecting layer 350 may be disposed on the plurality of lenses 343. The protecting layer 350 may be formed to expose the pad PAD in the non-display area NDA.

The plurality of lenses 343 may be disposed on the plurality of emitting elements 260. Each lens 343 may extend along the first direction (y axis direction) to have a size equal to or greater than each emitting element 260. The plurality of lenses 343 may be disposed parallel to each other along the first direction (y axis direction). For example, the first direction (y axis direction) may be a short axis direction, a vertical direction or an up and down direction in a display device of rectangular shape of 16:9.

Since the focusing of a light of the plurality of lenses 343 of a third embodiment is the same as that of a first embodiment, illustration on the focusing of a light of the plurality of lenses 343 may be omitted.

The display device according to a third embodiment of the present disclosure may further include the polarizing plate 500 on the protecting layer 350. A reflection of an external light may be reduced due to the polarizing plate 500.

Figure 16:
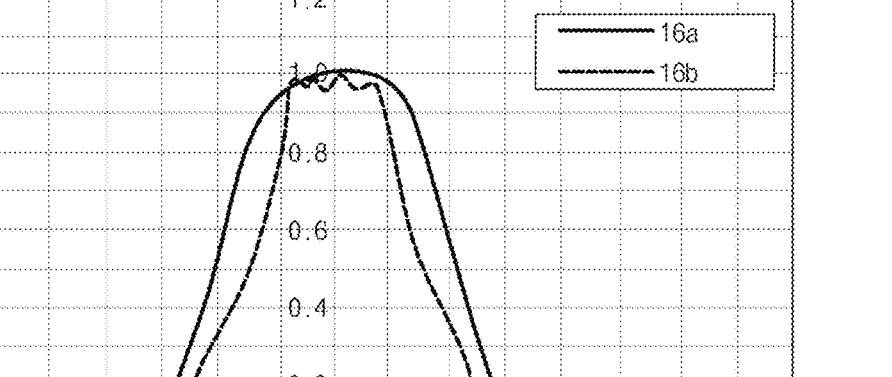
FIG. 16 is a graph showing a normalized transmittance intensity with respect to an up and down viewing angle of a display device according to the third embodiment of the present disclosure.

FIG. 16 is a graph showing a normalized transmittance intensity with respect to an up and down viewing angle of a display device according to a third embodiment of the present disclosure.

In FIG. 16, a display device according to a comparison example (16a) does not include a lens 343, a light absorbing pattern 317 and a first barrier layer 312 and includes a light control film on a display panel. A display device according to a third embodiment (16b) includes a lens 343, a light absorbing pattern 317 and a first barrier layer 312 and does not include a light control film.

The up and down viewing angle of the display device according to a third embodiment (16b) is smaller than the up and down viewing angle of the display device according to a comparison example (16a). Although the display device according to a comparison example (16a) has the up and down viewing angle of about ±35 degrees, the display device according to a third embodiment (16b) has the up and down viewing angle of about ±30 degrees. As a result, the up and down viewing angle of the display device is improved. In FIG. 12, an inversion of a viewing angle luminance 8*p* may occur due to an additional leakage light, for example, the second reflection light 8*e*. In FIG. 16, an inversion of a viewing angle luminance may not occur due to the light absorbing pattern 317.

Figure 17:
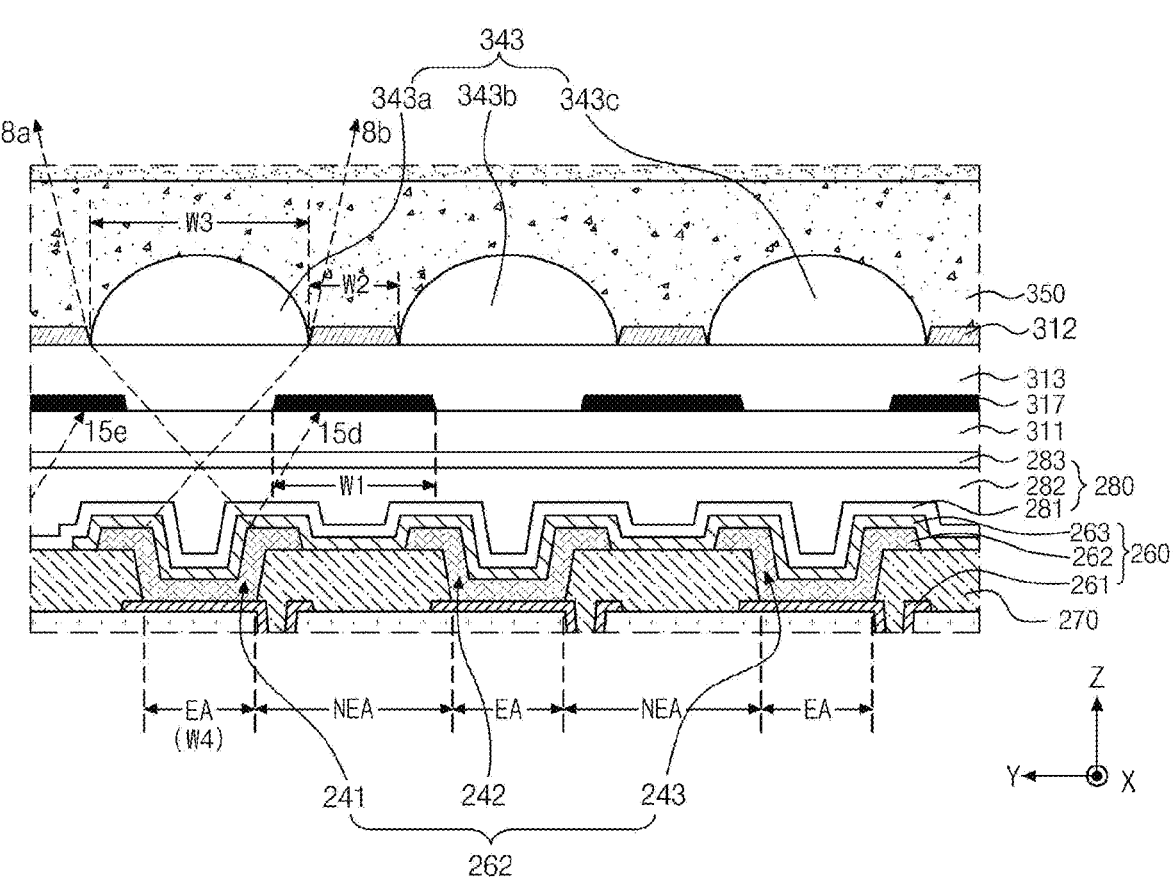
FIG. 17 is a cross-sectional view showing a display device according to a fourth embodiment of the present disclosure.

FIG. 17 is a cross-sectional view showing a display device according to a fourth embodiment of the present disclosure. FIG. 17 corresponds to a region 14A of FIG. 14.

Illustration on parts of the fourth embodiment the same as those of the first embodiment may be omitted, and the parts of the first embodiment may be intactly applied to those of the fourth embodiment.

In FIG. 17, a light absorbing pattern 317 may be disposed on the encapsulating layer 280 or on the touch buffer layer 311. The light absorbing pattern 317 may be a black matrix of black resin or dye. The embodiments of the present disclosure are not limited thereto. The insulating layer 313 may be disposed on the light absorbing pattern 317. The first barrier layer 312 and the lens 343 may be disposed on the insulating layer 313. The first barrier layer 312 may be disposed between the plurality of lenses 343*a*, 343*b* and 343*c*. For example, the plurality of lenses 343*a*, 343*b* and 343*c* may be disposed to correspond to (e.g., overlap) the emitting area EA. The first barrier layer 312 and the light absorbing pattern 317 may be disposed to correspond to the non-light emitting area NEA. The first barrier layer 312 may include the same material as the plurality of touch electrodes 320. The embodiments of the present disclosure are not limited thereto. Since the light absorbing pattern 317 is disposed to correspond to the non-light emitting area NEA, a leakage light 12*c* (of FIG. 12) between the lenses 343 may be blocked. When the light absorbing pattern 317 is not disposed, a first reflection light 12*d* (of FIG. 12) reflected on the second barrier layer 315 and a second reflection light 12*e* (of FIG. 12) reflected on the source electrode 213 and the drain electrode 214 may pass through the plurality of lenses 343. When the light absorbing pattern 317 is disposed to correspond to the non-light emitting area NEA, the first reflection light 15*e* and the second reflection light 15*d* may be blocked by the light absorbing pattern 317.

As a result, when the light absorbing pattern 317 of a black material is disposed to correspond to the non-emitting area NEA, reflection on the inner metal layer may be reduced and a leakage light through the lenses 343 may be prevented.

The light absorbing pattern 317 may have a first width W1, and the first barrier layer 312 may have a second width W2 that is smaller than the first width W1. Since the first width W1 of the light absorbing pattern 317 is greater than the second width W2 of the first barrier layer 312, a light passing outside the light absorbing pattern 317 and reflected on the first barrier layer 312 may be reduced or minimized. The lens 343 may have a third width W3, and the emitting area EA may have a fourth width W4 different from the third width W3. For example, the lens 343 may have a third width W3 that is greater than the fourth width W4. Since the third width W3 of the lens 343 is greater than the fourth width W4 of the emitting area EA, a light 8*a* and 8*b* of a front direction through the lens 343 may increase or be maximized.

As a result, when the light absorbing pattern 317 is wider than the first barrier layer 312, reflection on the first barrier layer 312 may be reduced and a leakage light due to the first barrier layer 312 may be prevented. Further, when the lens 343 is wider than the emitting area EA, a light through the lens 343 may increase.

Although not shown, only the light absorbing pattern 317 may be disposed on the touch buffer layer 311 and the first barrier layer 312 may not be disposed on the touch buffer layer 311. The embodiments of the present disclosure are not limited thereto.

A protecting layer 350 may be disposed on the first barrier layer 312, the plurality of lenses 343, the plurality of touch electrodes 320 and the touch routing line 330.

The plurality of lenses 343*a*, 343*b* and 343*c* may be disposed on the insulating layer 313 to correspond to the plurality of emitting areas EA, respectively. The protecting layer 350 may be disposed on the plurality of lenses 343. The protecting layer 350 may be formed to expose the pad PAD in the non-display area NDA.

The plurality of lenses 343 may be disposed on the plurality of emitting elements 260. Each lens 343 may extend along the first direction (y axis direction) to have a size equal to or greater than each emitting element 260. The plurality of lenses 343 may be disposed parallel to each other along the first direction (y axis direction). For example, the first direction (y axis direction) may be a short axis direction, a vertical direction or an up and down direction in a display device of rectangular shape of 16:9.

Since the focusing of a light of the plurality of lenses 343 of a fourth embodiment is the same as that of a first embodiment, illustration on the focusing of a light of the plurality of lenses 343 may be omitted.

The display device according to a fourth embodiment of the present disclosure may further include the polarizing plate 500 on the protecting layer 350. A reflection of an external light may be reduced due to the polarizing plate 500.

Figure 18:
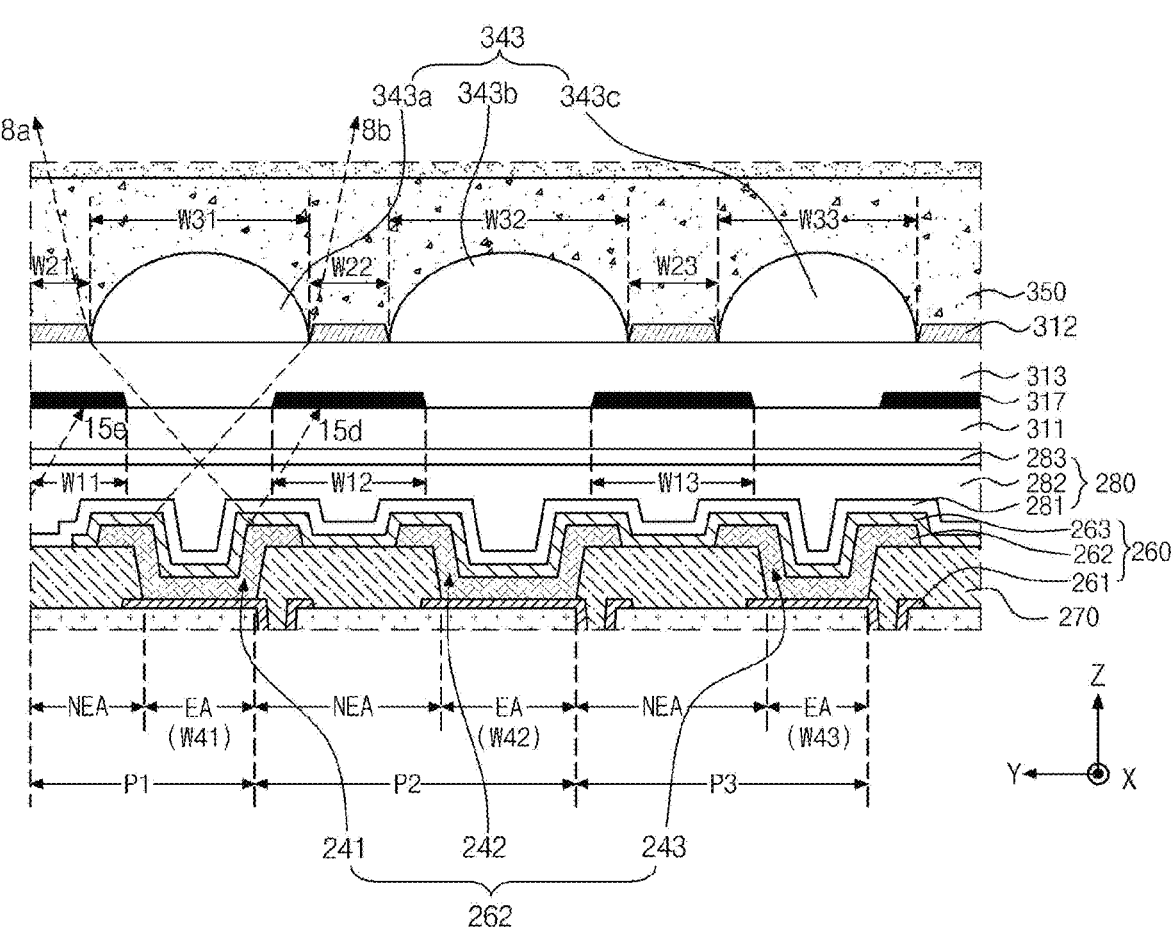
FIG. 18 is a cross-sectional view showing a display device according to a fifth embodiment of the present disclosure.

FIG. 18 is a cross-sectional view showing a display device according to a fifth embodiment of the present disclosure. FIG. 18 corresponds to a region 14A of FIG. 14. Illustration on parts of the fifth embodiment the same as those of the first embodiment may be omitted, and the parts of the first embodiment may be intactly applied to those of the fifth embodiment.

In FIG. 18, a light absorbing pattern 317 may be disposed on the encapsulating layer 280 or on the touch buffer layer 311. The light absorbing pattern 317 may be a black matrix of black resin or dye. However, the embodiments of the present disclosure are not limited thereto. The insulating layer 313 may be disposed on the light absorbing pattern 317 as shown in FIG. 18. The first barrier layer 312 and the lens 343 may be disposed on the insulating layer 313. The first barrier layers 312 may be disposed between the plurality of lenses 343*a*, 343*b* and 343*c*. For example, the plurality of lenses 343*a*, 343*b* and 343*c* may be disposed to respectively correspond to (e.g., overlap) the emitting area EA of first, second and third subpixels P1, P2 and P3. Each of the first barrier layers 312 and the light absorbing patterns 317 may be disposed to correspond to (e.g., overlap) the non-light emitting area NEA of a corresponding one of the first, second, and third subpixels P1, P2 and P3. The first barrier layer 312 may include the same material as the plurality of touch electrodes 320. However, the embodiments of the present disclosure are not limited thereto.

Since the light absorbing pattern 317 is disposed to correspond to the non-light emitting area NEA, a leakage light 12*c* (of FIG. 12) between the lenses 343 may be blocked. When the light absorbing pattern 317 is not disposed, a first reflection light 12*d* (of FIG. 12) reflected on the second barrier layer 315 and a second reflection light 12*e* (of FIG. 12) reflected on the source electrode 213 and the drain electrode 214 may pass through the plurality of lenses 343.

When the light absorbing pattern 317 is disposed to correspond to the non-light emitting area NEA, the first reflection light 15e and the second reflection light 15d may be blocked by the light absorbing pattern 317.

As a result, when the light absorbing pattern 317 of a black material is disposed to correspond to the non-emitting area EA, reflection on the inner metal layer may be reduced and a leakage light through the lenses 343 may be prevented.

The light absorbing patterns 317 of the first, second and third subpixels P1, P2 and P3 may have different widths. For example, the light absorbing patterns 317 of the first, second and third subpixels P1, P2 and P3 may have first-first, first-second and first-third widths W11, W12 and W13, respectively where the widths are different from each other. The first barrier layers 312 of the first, second and third subpixels P1, P2 and P3 may have different widths. For example, the first barrier layers 312 of the first, second and third subpixels P1, P2 and P3 have second-first, second-second, second-third widths W21, W22 and W23, respectively, where the widths are different from each other. The first-first width W11 may be smaller than the second-first width W21, the first-second width W12 may be smaller than the second-second width W22, and the first-third width W13 may be smaller than the second-third width W23. As a result, a light passing outside the light absorbing pattern 317 and reflected on the first barrier layer 312 may be reduced or minimized.

The lenses 343a, 343b and 343c of the first, second and third subpixels P1, P2 and P3 may have different widths. For example, the lenses 343a, 343b and 343c of the first, second and third subpixels P1, P2 and P3 may have third-first, third-second and third-third widths W31, W32 and W33, respectively, where the widths are different from each other. The emitting areas EA of the first, second and third subpixels P1, P2 and P3 may have different widths. For example, the emitting areas EA of the first, second and third subpixels P1, P2 and P3 have fourth-first, fourth-second and fourth-third widths W41, W42 and W43, respectively, where the widths are different from each other. The third-first width W31 may be greater than the fourth-first width W41, the third-second width W32 may be greater than the fourth-second width W42, and the third-third width W33 may be greater than the fourth-third width W43. As a result, a light 8a and 8b of a front direction through the lens 343 may increase or be maximized.

For example, the fourth-first width W41 corresponding to the first subpixel P1 of a red color may be smaller than the fourth-second width W42 corresponding to the second subpixel P2 of a green color and may be greater than the fourth-third width W43 corresponding to the third subpixel P3 of a blue color based on a luminance and a lifetime. Similarly, the third-first width W31 of the lens 343a corresponding to the first subpixel P1 of the red color may be smaller than the third-second width W32 of the lens 343b corresponding to the second subpixel P2 of the green color and may be greater than the third-third width W33 of the lens 343c corresponding to the third subpixel P3 of the blue color.

When the light absorbing pattern 317 is wider than the first barrier layer 312, reflection on the first barrier layer 312 may be reduced and a leakage light due to the first barrier layer 312 may be prevented. Further, when the lens 343 is wider than the emitting area EA, a light through the lens 343 may increase.

Although not shown, only the light absorbing pattern 317 may be disposed on the touch buffer layer 311 and the first barrier layer 312 may not be disposed on the touch buffer layer 311 in one embodiment. The embodiments of the present disclosure are not limited thereto.

A protecting layer 350 may be disposed on the first barrier layer 312, the plurality of lenses 343, the plurality of touch electrodes 320 and the touch routing line 330.

The plurality of lenses 343a, 343b and 343c may be disposed on the insulating layer 313 to correspond to the plurality of emitting areas EA, respectively. The protecting layer 350 may be disposed on the plurality of lenses 343. The protecting layer 350 may be formed to expose the pad PAD in the non-display area NDA.

The plurality of lenses 343 may be disposed on the plurality of emitting elements 260. Each lens 343 may extend along the first direction (y axis direction) to have a size equal to or greater than each emitting element 260. The plurality of lenses 343 may be disposed parallel to each other along the first direction (y axis direction). For example, the first direction (y axis direction) may be a short axis direction, a vertical direction or an up and down direction in a display device of rectangular shape of 16:9.

Since the focusing of a light of the plurality of lenses 343 of the fifth embodiment is the same as that of a first embodiment, illustration on the focusing of a light of the plurality of lenses 343 may be omitted.

The display device according to a fifth embodiment of the present disclosure may further include the polarizing plate 500 on the protecting layer 350. A reflection of an external light may be reduced due to the polarizing plate 500.

Consequently, in the display device according to an embodiment of the present disclosure, since a light control layer including at least one lens and a barrier layer is disposed on an encapsulating layer covering an emitting element, an up and down viewing angle and/or a right and left viewing angle may be controlled or cut off and a front luminance may be improved due to increase of a light extraction efficiency.

Further, a power consumption is reduced due to increase of a front luminance.

Example embodiments of the present disclosure can also be described as follows:

According to an example embodiment of a present disclosure, a display device may include: a display panel including a display area and a non-display area, the display area having a light emitting area and a non-light emitting area; at least one first barrier layer on the non-light emitting area of the display panel, the at least one first barrier layer configured to block light emitted from the light emitting area; at least one second barrier layer overlapping the at least one first barrier layer in the non-display area, the at least one second barrier layer configured to block light emitted from the light emitting area; and at least one lens overlapping the light emitting area and on a same layer as the at least one first barrier layer.

In some example embodiments, the at least one first barrier layer may include at least a portion of a first touch electrode comprising a mesh shape.

In some example embodiments, the at least one second barrier layer may include a black material configured to absorb the light.

In some example embodiments, a width of the at least one first barrier layer may be different from a width of the at least one second barrier layer.

In some example embodiments, the width of the at least one second barrier layer may be greater than the width of the at least one first barrier layer.

In some example embodiments, a width of the at least one lens may be different from a width of the light emitting area.

In some example embodiments, the width of the at least one lens may be greater than the width of the light emitting area.

In some example embodiments, the display area may include a first subpixel, a second subpixel, and a third subpixel each having a corresponding light emitting area and a corresponding non-light emitting area, and the at least one lens includes a plurality of lens including a first lens corresponding to the first subpixel, a second lens corresponding to the second subpixel, and a third lens corresponding to the third subpixel, wherein a width of the first lens corresponding to the first subpixel, a width of the second lens corresponding to the second subpixel, and a width of the third lens corresponding to the third subpixel are different from each other, and wherein the at least one first barrier layer includes a plurality of first barrier layers and a width of a first barrier layer from the plurality of first barrier layers that corresponds to the first subpixel, a width of a first barrier layer from the plurality of first barrier layers that corresponds to the second subpixel, and a width of a first barrier layer from the plurality of first barrier layers that corresponds to the third subpixel are different from each other.

In some example embodiments, a width of the first lens corresponding to the first subpixel may be greater than a width of the light emitting area corresponding to the first subpixel, a width of the second lens corresponding to the second subpixel may be greater than a width of the light emitting area corresponding to the second subpixel, and a width of the third lens corresponding to the third subpixel may be greater than a width of the light emitting area corresponding to the third subpixel.

In some example embodiments, the display device may further include: an insulating layer between the at least one first barrier layer and the at least one second barrier layer.

In some example embodiments, the at least one second barrier layer may include at least a portion of a second touch electrode comprising a mesh shape.

In some example embodiments, the display device may further include: a protecting layer covering the at least one lens, and a refractive index of the at least one lens may be greater than a refractive index of the protecting layer.

In some example embodiments, the at least one first barrier layer may be between a pair of lenses including the at least one lens.

In some example embodiments, the at least one first barrier layer and the at least one second barrier layer may include different materials.

According to another example embodiment of the present disclosure, a display device may include: a substrate including a display area and a non-display area; a plurality of emitting elements in the display area, the plurality of emitting elements configured to emit light; at least one encapsulating layer on the plurality of emitting elements; at least one barrier layer on the at least one encapsulating layer and non-overlapping with an emitting element from the plurality of emitting elements, the at least one barrier layer configured to block the light emitted by the plurality of emitting elements; and a plurality of lenses on the at least one encapsulating layer, the plurality of lenses overlapping the plurality of emitting elements.

In some example embodiments, the plurality of lenses may be non-overlapping with the at least one barrier layer.

In some example embodiments, the at least one barrier layer may include at least a portion of a touch electrode comprising a mesh shape.

In some example embodiments, the at least one barrier layer may include a black material configured to absorb the light.

In some example embodiments, the display device may further include: a protecting layer on the plurality of lenses, and a refractive index of the plurality of lenses may be greater than a refractive index of the protecting layer.

In some example embodiments, the at least one barrier layer may include: a first barrier layer in a same layer as the plurality of lenses; and a second barrier layer that is between the first barrier layer and the substrate, the second barrier layer overlapping the first barrier layer.

In some example embodiments, the display device may further include: a bridge electrode connected to the touch electrode, and the second barrier layer may include a same material as the bridge electrode.

In some example embodiments, the second barrier layer may include a black material configured to absorb the light.

According to another example embodiment of the present disclosure, a display device may include: a substrate including a display area and a non-display area; a plurality of light emitting elements in the display area, the plurality of light emitting elements configured to emit light; one or more intermediate layers on the plurality of light emitting elements; a plurality of touch electrodes on the one or more intermediate layers and non-overlapping with the plurality of light emitting elements, the plurality of touch electrodes configured to sense touch and block the light emitted from the plurality of light emitting elements; and a plurality of lenses that are overlapping with the plurality of light emitting elements.

In some example embodiments, the plurality of lenses may be non-overlapping with the plurality of touch electrodes.

In some example embodiments, the plurality of touch electrodes may be closer to the substrate than the plurality of lenses.

In some example embodiments, the plurality of touch electrodes may be on a same layer as the plurality of lenses.

In some example embodiments, at least one touch electrode from the plurality of touch electrodes may be between a pair of lenses from the plurality of lenses.

In some example embodiments, the display device may further include: a plurality of barrier layers between the plurality of touch electrodes and the substrate, the plurality of barrier layers overlapping the plurality of touch electrodes and non-overlapping with the plurality of light emitting elements.

In some example embodiments, the plurality of barrier layers may be non-overlapping with the plurality of lenses.

In some example embodiments, the plurality of barrier layers may include black material configured to absorb the light.

In some example embodiments, the plurality of barrier layers may include a reflective material.

In some example embodiments, the display device may further include: a protecting layer covering the plurality of lenses, the protecting layer having a refractive index that is less than a refractive index of the plurality of lenses.

It will be apparent to those skilled in the art that various modifications and variation can be made in the present disclosure without departing from the scope of the disclosure. Thus, it is intended that the present disclosure cover the modifications and variations of this disclosure, provided they come within the scope of the appended claims and their equivalents.

What is claimed is:

1. A display device, comprising:
a substrate including a display area having an emitting area and a non-emitting area and a non-display area having a pad area;
a plurality of emitting elements in the display area, each of the plurality of emitting elements including a first electrode, an emitting layer and a second electrode;
a bank layer covering an edge portion of the first electrode and including a black material;
an encapsulating layer on the plurality of emitting elements;
a touch buffer layer, an insulating layer, and a protecting layer sequentially on the encapsulating layer;
at least one lens on the insulating layer and corresponding to the emitting area, a refractive index of the at least one lens and a refractive index of the protecting layer different from each other; and
a dam surrounding an edge portion of the display area, the dam including a same material as the bank layer,
wherein at least one of the touch buffer layer, the insulating layer, and the protecting layer extends to the pad area crossing the dam.

2. The display device of claim 1, wherein a pad is disposed in the pad area.

3. The display device of claim 2, further comprising:
a touch electrode between the insulating layer and the protecting layer,
wherein the touch electrode extends to the pad area and is connected to the pad.

4. The display device of claim 3, further comprising:
a barrier layer between the touch buffer layer and the insulating layer; and
a black matrix between the insulating layer and the protecting layer.

5. The display device of claim 4, wherein the black matrix overlaps the bank layer.

6. The display device of claim 4, wherein the black matrix overlaps the touch electrode.

7. The display device of claim 4, wherein the at least one lens includes a plurality of lenses and the black matrix is disposed between the plurality of lenses.

8. The display device of claim 4, wherein the barrier layer and the black matrix correspond to the non-emitting area.

9. The display device of claim 4, wherein the barrier layer includes at least a portion of the touch electrode comprising a mesh shape.

10. The display device of claim 4, wherein a width of the barrier layer is different from a width of the black matrix.

11. The display device of claim 10, wherein the width of the black matrix is greater than the width of the barrier layer.

12. The display device of claim 4, wherein the at least one lens is non-overlapping with the barrier layer.

13. The display device of claim 4, wherein the barrier layer overlaps the black matrix.

14. The display device of claim 4, further comprising:
a bridge electrode connected to the touch electrode,
wherein the black matrix includes a same material as the bridge electrode.

15. The display device of claim 1, wherein a width of the at least one lens is different from a width of the emitting area.

16. The display device of claim 15, wherein the width of the at least one lens is greater than the width of the emitting area.

17. The display device of claim 1, further comprising:
a barrier layer between the touch buffer layer and the insulating layer,
wherein the display area includes a first subpixel, a second subpixel, and a third subpixel each having the emitting area and the non-emitting area,
wherein the at least one lens includes a first lens, a second lens, and a third lens corresponding to the first subpixel, the second subpixel, and the third subpixel, respectively, and the barrier layer includes a first barrier layer, a second barrier layer, and a third barrier layer corresponding to the first subpixel, a second subpixel, and a third subpixel, respectively,
wherein widths of the first lens, the second lens, and the third lens are different from each other, and widths of the first barrier layer, the second barrier layer, and the third barrier layer are different from each other.

18. The display device of claim 17, wherein the width of the first lens is greater than a width of the emitting area of the first subpixel, the width of the second lens is greater than a width of the emitting area of the second subpixel, and the width of the third lens is greater than a width of the emitting area of the third subpixel.

19. The display device of claim 1, wherein the refractive index of the at least one lens is greater than the refractive index of the protecting layer.

20. The display device of claim 1, further comprising:
a barrier layer between the touch buffer layer and the insulating layer,
wherein a height of an apex point of a curved surface of the at least one lens with respect to the substrate is higher than a height of an upper surface of the barrier layer with respect to the substrate.

* * * * *